(12) United States Patent
Hashimoto

(10) Patent No.: US 7,521,796 B2
(45) Date of Patent: *Apr. 21, 2009

(54) METHOD OF MAKING THE SEMICONDUCTOR DEVICE, CIRCUIT BOARD, AND ELECTRONIC INSTRUMENT

(75) Inventor: Nobuaki Hashimoto, Nagano-Ken (JP)

(73) Assignee: Seiko Epson Corporation, Tokyo (JP)

( * ) Notice: Subject to any disclaimer, the term of this patent is extended or adjusted under 35 U.S.C. 154(b) by 195 days.

This patent is subject to a terminal disclaimer.

(21) Appl. No.: 11/480,846

(22) Filed: Jul. 6, 2006

(65) Prior Publication Data

US 2006/0249843 A1    Nov. 9, 2006

Related U.S. Application Data

(60) Division of application No. 10/463,470, filed on Jun. 18, 2003, now Pat. No. 7,183,189, which is a continuation of application No. 09/666,406, filed on Sep. 20, 2000, now Pat. No. 6,608,389, which is a continuation of application No. 09/117,526, filed on Oct. 21, 1998, now Pat. No. 6,255,737.

(51) Int. Cl.
*H01L 23/48* (2006.01)
(52) U.S. Cl. ............... 257/734; 257/700; 257/737
(58) Field of Classification Search ............ 257/734, 257/737, 700
See application file for complete search history.

(56) References Cited

U.S. PATENT DOCUMENTS

| | | | |
|---|---|---|---|
| 5,067,007 A | 11/1991 | Otsuka et al. | |
| 5,111,278 A * | 5/1992 | Eichelberger | 257/698 |
| 5,128,746 A | 7/1992 | Pennisi et al. | |
| 5,148,266 A | 9/1992 | Khandros et al. | |
| 5,243,221 A | 9/1993 | Ryan et al. | |
| 5,319,246 A | 6/1994 | Nagamine et al. | |
| 5,416,355 A | 5/1995 | Kudoh | |
| 5,436,410 A | 7/1995 | Jain et al. | |
| 5,457,067 A | 10/1995 | Han | |
| 5,475,268 A | 12/1995 | Kawagoe et al. | |
| 5,525,839 A | 6/1996 | Shu | |
| 5,528,061 A | 6/1996 | Iwasaki | |
| 5,530,289 A | 6/1996 | Hirano et al. | |

(Continued)

FOREIGN PATENT DOCUMENTS

CN    1123468 A    5/1996

(Continued)

OTHER PUBLICATIONS

Applicant's Separate Record of the Substance of Personal Interview.

*Primary Examiner*—Thanh Nguyen
(74) *Attorney, Agent, or Firm*—Oliff & Berridge, PLC

(57) ABSTRACT

A semiconductor device with a package size close to its chip size is, apart from a stress absorbing layer, such as to effectively absorb thermal stresses. A semiconductor device (150) has a semiconductor chip provided with electrodes (158), a resin layer (152) forming a stress relieving layer provided on the semiconductor chip, wiring (154) formed from the electrodes (158) to over the resin layer (152), and solder balls (157) formed on the wiring (154) over the resin layer (152); the resin layer (152) is formed so as to have a depression (152*a*) in the surface, and the wiring (154) is formed so as to pass over the depression (152*a*).

16 Claims, 24 Drawing Sheets

U.S. PATENT DOCUMENTS

| | | | |
|---|---|---|---|
| 5,532,516 A | 7/1996 | Pasch et al. | |
| 5,534,731 A | 7/1996 | Cheung | |
| 5,561,327 A | 10/1996 | Jun | |
| 5,604,379 A | 2/1997 | Mori | |
| 5,614,439 A | 3/1997 | Murooka et al. | |
| 5,614,767 A | 3/1997 | Ohara | |
| 5,656,852 A | 8/1997 | Nishioka et al. | |
| 5,672,548 A | 9/1997 | Culnane et al. | |
| 5,739,588 A | 4/1998 | Ishida et al. | |
| 5,744,859 A | 4/1998 | Ouchida | |
| 5,834,844 A | 11/1998 | Akagawa et al. | |
| 5,841,193 A * | 11/1998 | Eichelberger | 257/723 |
| 5,861,673 A | 1/1999 | Yoo et al. | |
| 5,861,674 A | 1/1999 | Ishikawa | |
| 5,942,801 A | 8/1999 | Tran | |
| 5,955,787 A | 9/1999 | Yu et al. | |
| 5,962,920 A | 10/1999 | Ueda et al. | |
| 5,969,409 A | 10/1999 | Lin | |
| 5,981,373 A | 11/1999 | Sunada | |
| 6,159,837 A | 12/2000 | Yamaji et al. | |
| 6,229,209 B1 | 5/2001 | Nakamura et al. | |

FOREIGN PATENT DOCUMENTS

| | | |
|---|---|---|
| CN | 1132003 A | 9/1996 |
| GB | A-2-027-272 | 2/1980 |
| JP | A-52-008785 | 1/1977 |
| JP | A-55-018069 | 2/1980 |
| JP | A 59-188153 | 10/1984 |
| JP | A-61-253826 | 11/1986 |
| JP | A 61-294838 | 12/1986 |
| JP | A-63-072143 | 4/1988 |
| JP | A-63-229839 | 9/1988 |
| JP | A 63-307759 | 12/1988 |
| JP | A-64-1257 | 1/1989 |
| JP | A-01-108745 | 4/1989 |
| JP | A-01-196856 | 8/1989 |
| JP | A-01-209746 | 8/1989 |
| JP | A-01310549 | 12/1989 |
| JP | A-2-109358 | 4/1990 |
| JP | A 2-130828 | 5/1990 |
| JP | A-03-020041 | 1/1991 |
| JP | U-03-023928 | 3/1991 |
| JP | A-03-198342 | 8/1991 |
| JP | A-4-10429 | 1/1992 |
| JP | U-4-74427 | 6/1992 |
| JP | A-4-313256 | 11/1992 |
| JP | A 4-346231 | 12/1992 |
| JP | A 5-055533 | 3/1993 |
| JP | A 5-074770 | 3/1993 |
| JP | A 5-082518 | 4/1993 |
| JP | A-05-226416 | 9/1993 |
| JP | A 5-267474 | 10/1993 |
| JP | A-05-291262 | 11/1993 |
| JP | A-5-315445 | 11/1993 |
| JP | A 6-013468 | 1/1994 |
| JP | A 6-021061 | 1/1994 |
| JP | A-06-069211 | 3/1994 |
| JP | A-06-077283 | 3/1994 |
| JP | A 7-169835 | 7/1995 |
| JP | A-08-031872 | 2/1996 |
| JP | A-08-097217 | 4/1996 |
| JP | A-08-172114 | 7/1996 |
| JP | A-08-203906 | 8/1996 |
| JP | A-08-250549 | 9/1996 |

* cited by examiner

METHOD OF MAKING THE SEMICONDUCTOR DEVICE, CIRCUIT BOARD, AND ELECTRONIC INSTRUMENT

This is a Division of application Ser. No. 10/463,470 filed Jun. 18, 2003, which in turn is a Continuation of application Ser. No. 09/666,406 (now U.S. Pat. No. 6,608,389), which in turn is a Continuation of application Ser. No. 09/117,526 (now U.S. Pat. No. 6,255,737), which is the National Stage of International Application No. PCT/JP97/04438 filed Dec. 4, 1997. The entire disclosure of the prior applications is hereby incorporated by reference herein in its entirety.

TECHNICAL FIELD

The present invention relates to a semiconductor device and method of making the same, a circuit board, and an electronic instrument, and in particular relates to a semiconductor device having a package size close to the chip size and a method of making the same, a circuit board, and an electronic instrument.

BACKGROUND ART

To pursue high-density mounting in semiconductor devices, bare chip mounting is the ideal. However, for bare chips, quality control and handling are difficult. In answer to this, CSP (chip size package), or packages whose size is close to that of the chip, have been developed.

Of the forms of CSP semiconductor device developed, one form has a flexible substrate provided, patterned on the active surface of the semiconductor chip, and on this flexible substrate are formed a plurality of external electrodes. It is also known to inject a resin between the active surface of the semiconductor chip and the flexible substrate, in order to absorb the terminal stress.

However, in cases where resin alone is insufficient to absorb the thermal stress, another means is required.

The present invention has as its object the solution of the above described problems, and this object subsists in the provision of a semiconductor device and method of making the same, a circuit board, and an electronic instrument such that the package size is close to the chip size, and such that apart from the stress absorbing layer, thermal stress can be effectively absorbed.

DISCLOSURE OF INVENTION

The method of making a semiconductor device of the present invention comprises:

a step of providing a wafer on which are formed electrodes, a step of providing a first stress relieving layer on the wafer avoiding at least a part of the electrodes;

a step of forming a first conducting portion over the first stress relieving layer from the electrodes;

a step of forming external electrodes connected to the first conducting portion on the first stress relieving layer;, and a stop of cutting the wafer into individual pieces, and wherein in at least one of the step of providing the first stress relieving layer and the step of forming the first conducting portion a construction is formed which increases the relief of stress.

According to the aspect of the present invention, since the conducting portions and external electrodes are formed over a stress relieving layer, this obviates the need for a substrate such as a patterned film with preformed_external electrodes.

Besides, since the conducting portions between the electrodes and the external electrodes can be formed freely according to the requirements of the design, the layout of the external electrodes can be determined regardless of the layout of the electrodes. As a result, without changing the circuit design of the elements formed on the wafer, various semiconductor devices with the external electrodes in different positions can easily be fabricated.

Furthermore, according to the aspect of the present invention, after the stress relieving layer, conducting portions and external electrodes are formed on the wafer, the wafer is cut, to obtain individual semiconductor devices. As a result, the formation of the stress relieving layer, conducting portions and external electrodes on a large number of semiconductor devices can be carried out simultaneously, and the fabrication process can be simplified.

As the construction which increases the relief of stress, a depression may be formed on the surface of the first stress relieving layer, and the first conducting portion is formed to pass over the depression.

By this means, since the conducting portion is formed to be bent in a direction intersecting to the surface of the stress relieving layer, the stress can be absorbed by a variation of the bending condition, and wiring breaks can be prevented.

As the construction which increases the relief of stress, in the step of forming the first conducting portion, the first conducting portion may be formed so as to be bent in a direction of a horizontal plane on the first stress relieving layer.

There may further be a step of inserting an elastic body over the first conducting portion positioned at the depression. By means of this elastic body, stress can be further absorbed.

There may further be a step of providing a second stress relieving layer and a second conducting portion connected to the first conducting portion on the first stress relieving layer on which the first conducting portion is formed.

By this means, the stress relieving layer is formed as a plurality of layers, and the stress is thereby even more easily distributed.

At least one of the first conducting portion and the second conducting portion may be formed in planar form, to have its larger planar extent than its thickness.

By this means, since a signal is transmitted in the vicinity of a planar ground potential, an ideal transmission path is obtained.

A second stress relieving layer and a second conducting portion may be provided on the first stress relieving layer on which the first conducting portion is formed;

a third stress relieving layer and a third conducting portion may be provided on the second stress relieving layer on which the second conducting portion is formed; and the second conducting portion may be formed in linear form, and the first and third conducting portions may be formed in planar form, to have their larger planar extent than that of the second conducting portion.

By this means, since the linearly formed second conducting portion is sandwiched between a pair of planar conducting portions, it is covered by surrounding wires at ground potential. In this way a construction similar to coaxial cable is obtained, and the signal passing through the second conducting portion is less susceptible to the influence of noise.

A pair of wires at ground potential may be formed parallel to and on both side of the first conducting portion.

By this means, since the linearly formed first conducting portion is sandwiched between a pair of wires, it is covered by surrounding wires at ground potential. In this way a construction similar to coaxial cable is obtained, and the signal is less susceptible to the influence of noise.

The semiconductor device of the present invention comprises:

a semiconductor chip having electrodes;

a first stress relieving layer provided on the semiconductor chip so as to avoid at least a part of the electrodes;

a first conducting portion formed from the electrodes over the first stress relieving layer; and external electrodes formed on the first conducting portion positioned above the first stress relieving layer, and wherein the first stress relieving layer is formed to have a depression on its surface, and the first conducting portion is formed to pass over the depression.

By this means, since the conducting portion is formed to be bent in a direction intersecting to the surface of the stress relieving layer, the stress can be absorbed by a variation of the bending condition, and wiring breaks can be prevented.

On the first conducting portion positioned over the depression, an elastic body may be provided so as to fill the depression.

The first conducting portion may be formed to be bent over the first stress relieving layer.

The first conducting portion may be formed to have a bellows form.

A second stress relieving layer and a second conducting portion connected to the first conducting portion may be provided on the first stress relieving layer on which the first conducting portion is formed.

By this means, the stress relieving layer is formed as a plurality of layers, and the stress is thereby even more easily distributed.

One of two conducting portions consisting of the first conducting portion and the second conducting portion may be, formed in a linear form, and the other may be formed in planar form, to have its larger planar extent than that of the linear conducting portion.

The planar conducting portion may be at ground potential, and a signal is input in the linear conducting portion.

The semiconductor device may further comprises:

a second stress relieving layer and a second conducting portion provided on the first stress relieving layer on which the first conducting portion is formed; and a third stress relieving layer and a third conducting portion provided on the second stress relieving layer on which the second conducting portion is formed, and wherein the second conducting portion may be formed in linear form, and the first and third conducting portions are formed in planar form to have its larger planar extent than that of the second conducting portion.

By this means, since the linearly formed second conducting portion is sandwiched between a pair of planar conducting portions, it is covered by surrounding wires at ground potential. In this way a construction similar to coaxial cable is obtained, and the signal passing through the second conducting portion is less susceptible to the influence of noise.

There may further be a pair of wires at ground potential formed parallel to and on both sides of the first conducting portion.

By this means, since the linearly formed first conducting portion is sandwiched between a pair of wires, it is covered by surrounding wires at ground potential. In this way a construction similar to coaxial cable is obtained, and the signal is less susceptible to the influence of noise.

There may further be a protective film on a surface of the semiconductor chip opposite to a surface having the electrodes.

There may further be a radiator on a surface of the semiconductor chip opposite to a surface having the electrodes.

On the circuit board of the present invention is mounted the above described semiconductor device.

The electronic instrument of the present invention has this circuit board.

BRIEF DESCRIPTION OF THE DRAWINGS

FIGS. 9A to 3D illustrate the method of making a semiconductor device being a basic of the present invention;

BEST MODE FOR CARRYING OUT THE INVENTION

Before the description of the embodiments of the present invention, the basic art is described.

(First Basic Art)

Figure 5:
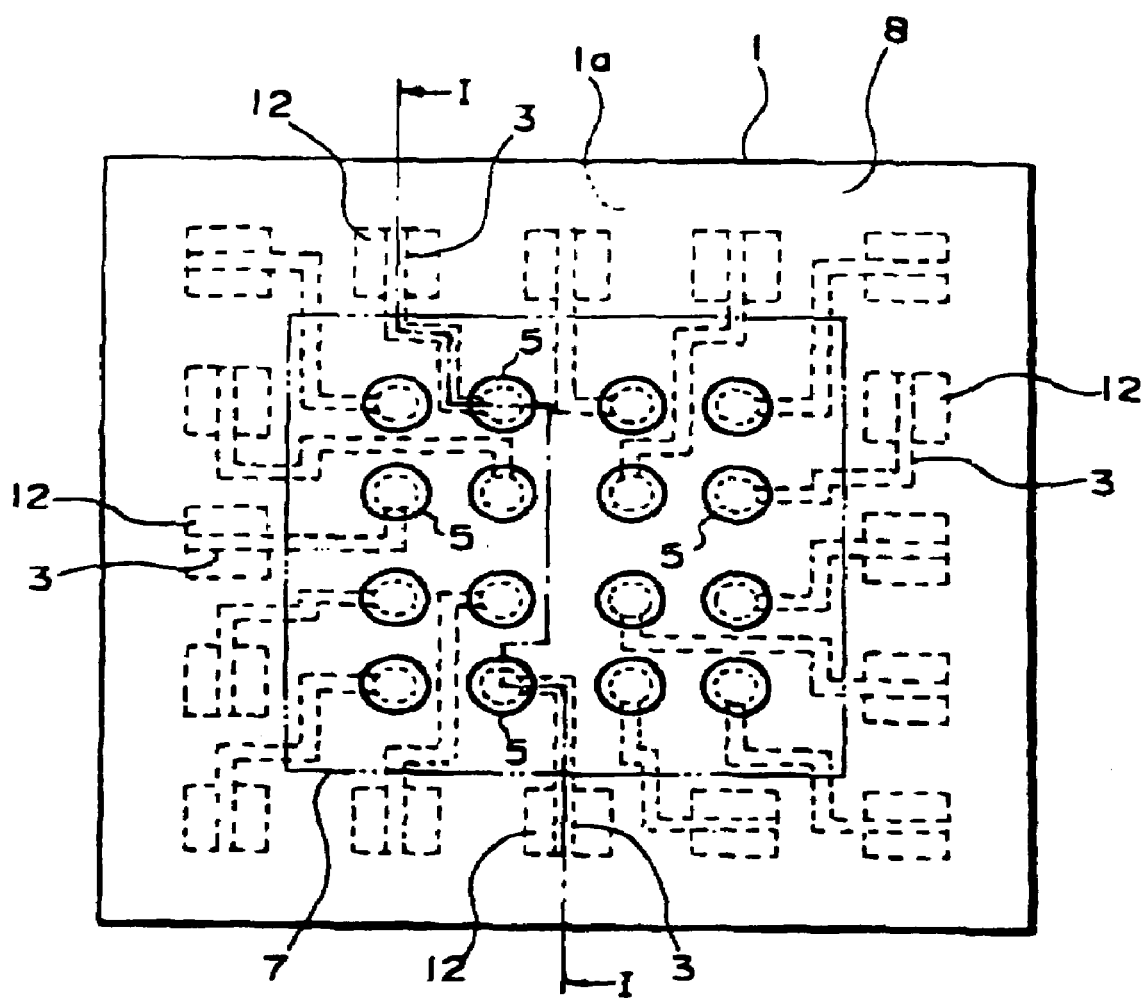
FIG. 5 is a plan view showing the semiconductor device being a basic of the present invention.

FIG. 5 is a plan view of a semiconductor device of this basic art. This semiconductor device is classified as a so-called CSP, and has wires 3 formed extending toward the center of an active surface 1a from electrodes 12 of a semiconductor chip 1, and on each wire 3 is provided an external electrode 5. All of the external electrodes 5 are provided on a stress relieving layer 7, so that when mounted on a circuit board (not shown in the drawings) the stresses can be relieved. Besides, over the external electrodes 5, a solder resist layer 8 is formed as a protective film.

It should be noted that as shown in this drawing the external electrodes 5 are provided not on the electrodes 12 of the semiconductor chip 1, but in the active region (the region in which the active elements are formed) of the semiconductor chip 1. By providing the stress relieving layer 7 in the active region, and further positioning (bringing in) the wires 3 within the active region, the external electrodes 5 can be provided within the active region. As a result, when laying out the external electrodes 5, the active region, that is to say, a region of a particular surface can be provided, and thus the degree of freedom for positioning the external electrodes 5 is greatly increased.

By bending the wires 3 on the stress relieving layer 7, the external electrodes 5 can be provided in a lattice. Besides, at the junction of the electrodes 12 and wires 3 the size of the electrodes 12 and the size of the wires 3 are such that:

wires 3<electrodes 12 but it is preferable that:

electrodes 12≦wires 3

In particular, in the case that:

electrodes 12<wires 3 not only is the resistance of the wires 3 reduced, but also, since the strength is increased, broken wires are prevented.

FIGS. 1A to 4C illustrate the first basic art of the method of making a semiconductor device, and correspond to the section along the line I-I in FIG. 5.

First, by well-known techniques, electrodes 12 and other elements are formed on a wafer 10. It should be noted that in this example, the electrodes 12 are formed of aluminum. As examples of other materials for the electrodes 12 may equally be used aluminum alloy materials (for example, aluminum-silicon or aluminum-silicon-copper, or the like)

Besides, on the surface of the wafer 10 is formed a passivation film (not shown in the drawings) being an oxidized film or the like, for preventing chemical changes. The passivation film is formed not only to avoid the electrodes 12, but also to avoid the scribing line to which dicing is carried out. By not forming the passivation film on the scribing line, during the dicing operation the generation of dust can be avoided, and the occurrence of cracks in the passivation film can also be prevented.

Figure 1A:
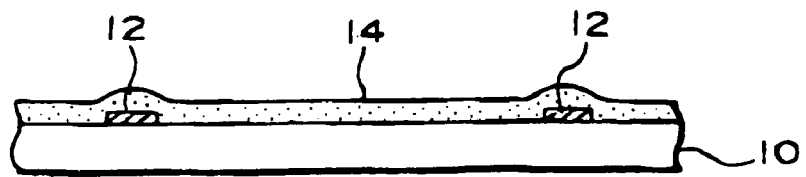
FIGS. 1A to 1E illustrate a method of making a semiconductor device being a basic of the present invention.

As shown in FIG. 1A, on the water 10 having the electrodes 12 a photosensitive polyimide resin is applied (using, for example, the spin coating method) to form a resin layer 14. The resin layer 14 has a thickness preferably in the range 1 to 100 µm, and more preferably of around 10 µm. It should be noted that in the spin coating method, since there is a large quantity of polyimide resin wasted, a device may be used which employs a pump to eject a strip of polyimide resin. As an example of such a device may be given, for example, the FAS ultra-high-density ejection coating system (see U.S. Pat. No. 4,696,885) manufactured by the FAS company.

Figure 1B:
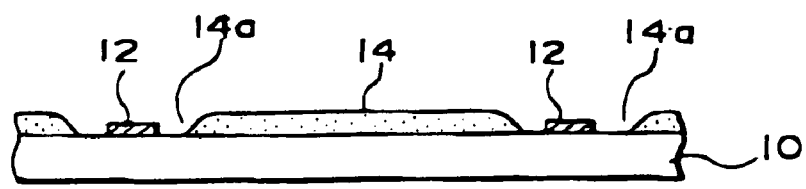

As shown in FIG. 1B, in the resin layer 14 are formed contact holes 14a for the electrodes 12. Specifically, by means of exposure, development, and firing processes, the polyimide resin in the vicinity of the electrodes 12 is removed, whereby the contact holes 14a are formed in the resin layer 14. It should be noted that in this figure, when the contact holes 14a are formed, absolutely no region is left in which the resin layer 14 overlaps the electrodes 12. By leaving absolutely none of the resin layer 14 on the electrodes 12, there is the advantage that in the subsequent stages in which wiring and other metallic components are provided, the electrical contact is satisfactory, but the construction is not necessarily restricted in this way. That is to say, even in a construction in which on the outer periphery of the electrodes 12 the resin layer 14 is applied, if holes are provided so that a part of the electrodes 12 is exposed, this will adequately achieve the objective. In this case, the number of bends in the wiring layer is reduced, and as a result, a loss of wiring reliability due to broken wires and the like can be prevented. Here, the contact holes 14a have a taper. As a result, at the edges where the contact holes 14a are formed, the resin layer 14 is formed with an inclination. Such a formation can be achieved by selection of the conditions of exposure and development. Furthermore, by treatment of the electrodes 12 by a plasma of $O_2$, even if a small amount of the polyimide resin Is left remaining on the electrodes 12, the polyimide resin can be completely removed. The resin layer 14 formed in this way forms the stress relieving layer in the completed semiconductor device.

It should be noted that in this example a Photosensitive polyimide resin is used as the resin, but a nonphotosensitive resin may equally be used. For example, a material with a stress relieving function having a low Young's modulus (not exceeding $1 \times 10^{10}$ Pa) when solidified, such as a silicone denatured polyimide resin, an epoxy resin, or a silicone denatured epoxy resin, may be used.

Figure 1C:
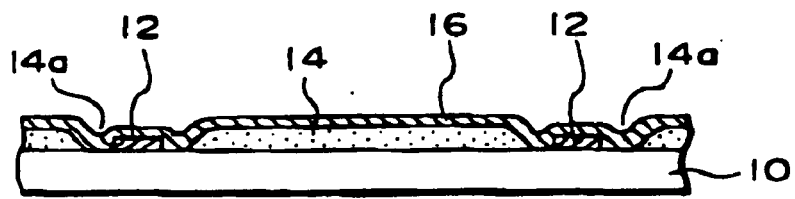
Figure 1D:
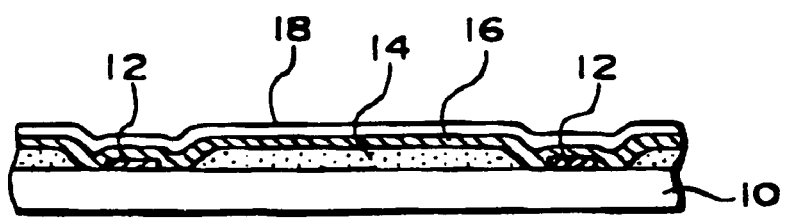

As shown in FIG. 1C, a chromium (Cr) layer 16 is formed by sputtering over the whole surface of the wafer 10. The chromium (Cr) layer 16 is formed over both the electrodes 12 and the resin layer 14. Here, the material of the chromium (Cr) layer 16 is selected to have good adhesion with the polyimide forming the resin layer 14. Alternatively, when resistance to cracks is considered, a ductile metal such as aluminum, alloys of aluminum such as aluminum-silicon and aluminum-copper, alloys of copper (Cu), copper, or gold may be used. If titanium, which has excellent moisture resistance, is selected, wire breakages due to corrosion can be prevented. Titanium also has preferred adhesion with respect to polyimide, and titanium-tungsten may also be used.

When the adhesion with the chromium (Cr) layer 16 is considered, it is preferable for the surface of the resin layer 14 of polyimide or the like to be roughened. For example, by carrying out dry processing with a plasma ($O_2$, $CF_4$), or wet processing with an acid or alkali, the surface of the resin layer 14 can be roughened.

Besides, since within the contact holes 14a the edges of the resin layer 14 are inclined, in this region the chromium (Cr)

layer 16 is formed to be similarly inclined. In the semiconductor device which is the finished product the chromium (Cr) layer 16 forms the wires 3 (see FIG. 5), and also during the fabrication process serves as a layer to prevent dispersion of the polyimide resin at the time of thereafter forming the layer. It should be noted that the dispersion preventing layer is not restricted to chromium (Cr), and all of the above-mentioned wiring materials are also effective.

Figure 10:
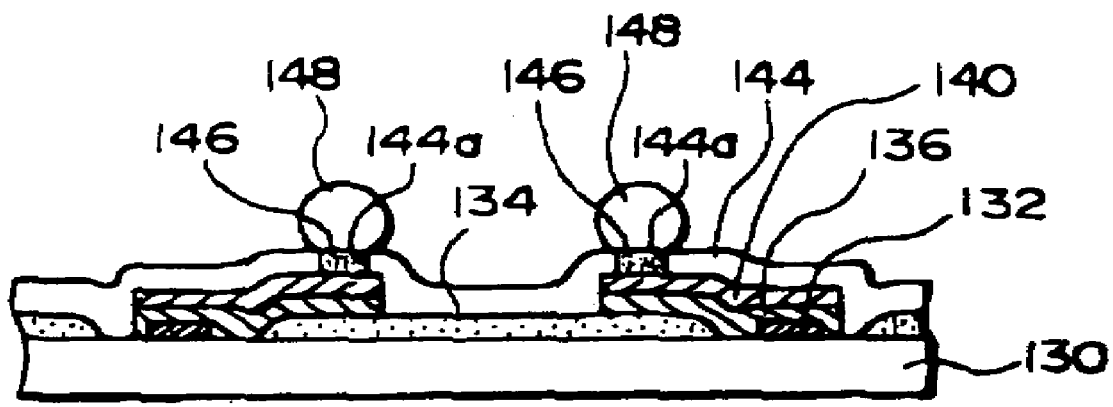
FIG. 10 illustrates the method of making a semiconductor device being a basic of the present invention.

As shown in FIG. 10, on the chromium (Cr) layer 16, a photoresist is applied to form a resist layer 18.

Figure 1E:
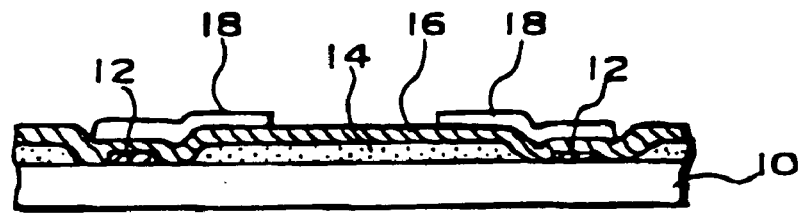

As shown in FIG. 1E by means of exposure, development, and firing processes, a part of the resist layer 18 is removed. The remaining resist layer 18, is formed from the electrodes 12 in the direction of the center of the resin layer 14. In more detail, the remaining resist layer 18 is formed so that on the resin layer 14 the portion of the resist layer 18 on one electrode 12 and the portion of the resist layer 18 on another electrode 12 are not continuous (are mutually independent).

Next, leaving only the region covered by the resist layer 18 shown in FIG. 1E (that is to say, with the resist layer 18 as a mask), the chromium (Cr) layer 16 is etched, and the resist layer 18 is removed. With this, in these previous processes metal thin film formation technology in wafer processing is applied. The chromium (Cr) layer 16 thus etched is shown in FIG. 2A.

Figure 2A:
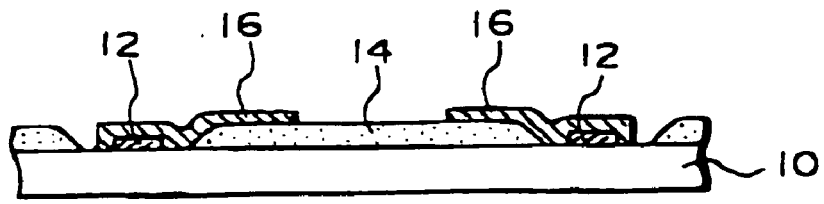
FIGS. 2A to 2E illustrate the method of making a semiconductor device being a basic of the present invention.
Figure 2B:
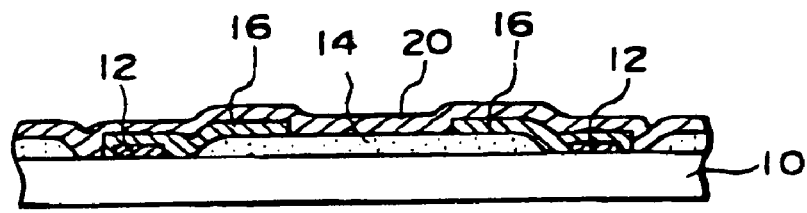

In FIG. 2A, the chromium (Cr) layer 16 is formed extending from the electrodes 12 over the resin layer 14. In more detail, the chromium (Cr) layer 16 is formed so as not to connect one electrode 12 to another electrode 12. That is to say, the chromium (Cr) layer 16 is formed in such a way that the wiring corresponding to each of the electrodes 12 can be formed.

Figure 2C:
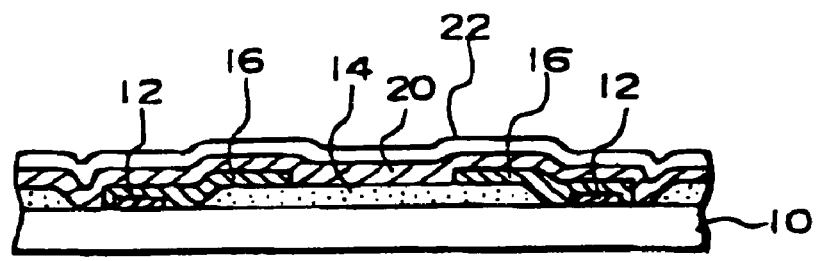
Figure 2D:
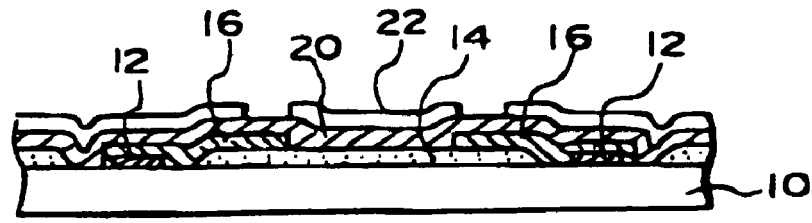
Figure 2E:
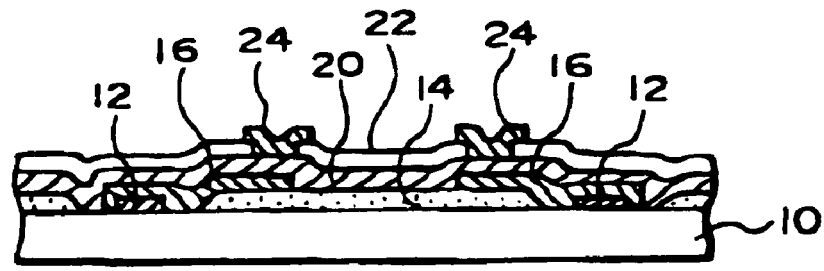

As shown in FIG. 2E, above the topmost layer including at least the chromium (Cr) layer 16, a copper (Cu) layer 20 is formed by sputtering. The copper (Cu) layer 20 forms an under-layer for forming external electrodes. Alternatively, in place of the copper (Cu) layer 20, a nickel (Ni) layer may be formed.

As shown in FIG. 2C, on the copper (Cu) layer 20 is formed a resist layer 22, and as shown in FIG. 2D, a part of the resist layer 22 is removed by exposure, development, and firing processes. In this way, as for the region removed, at least a part of the resist layer 22 positioned over the resin layer 14, and over the chromium (Cr) layer 16 is removed.

As shown in FIG. 2E, in the region in which the resist layer 22 is partially removed, a base 24 is formed. The base 24 is formed by copper (Cu) plating, and is such that a solder balls can be formed thereon. As a result, the base 24 is formed on the copper (Cu) layer 20, and is electrically connected through this copper (Cu) layer 20 and the chromium (Cr) layer 16 to the electrodes 12.

Figure 3A:
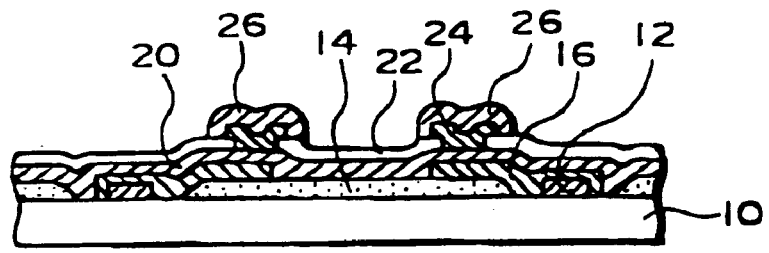
FIGS. 3A to 3D illustrate the method of making a semiconductor device being a basic of the present invention.
Figure 3B:
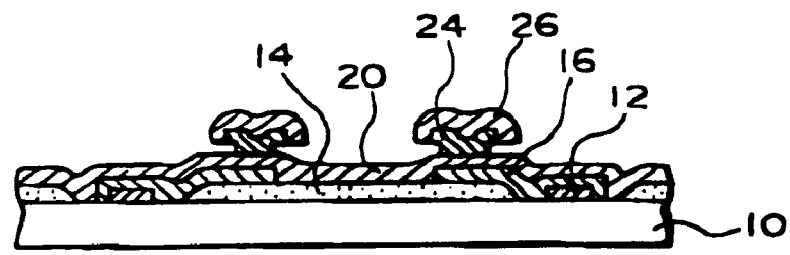
Figure 3C:
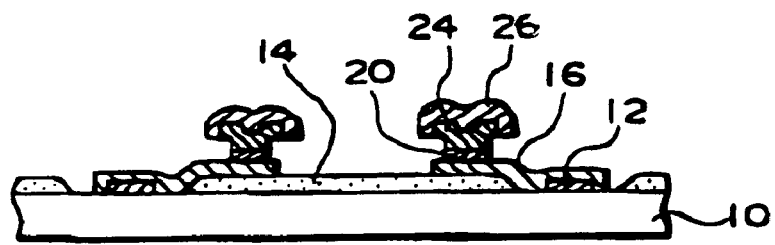
Figure 3D:
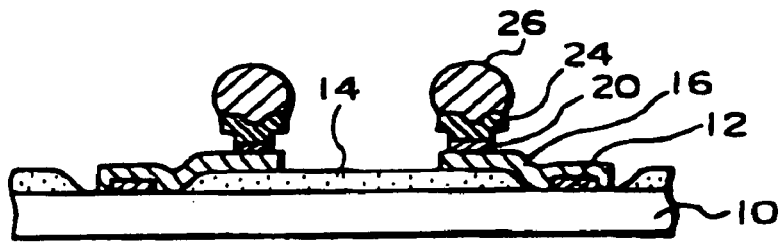

As shown in FIG. 3A, on the base 24, solder 26 which will form solder balls as the external electrodes 5 (see FIG. 5) is formed as a thick film. This thickness is determined by the amount of solder corresponding to the ball diameter required when at a later state the solder balls are formed. The layer of solder 26 is formed by electroplating, printing, or the like.

As shown in FIG. 38, the resist layer 22 shown in FIG. 3A is removed, and the copper (Cu) layer 20 is etched. In this way, the base 24 forms a mask, the copper (Cu) layer 20 remains only under this base 24 (see FIG. 3C). Next, the solder 26 on the base 24 is formed into balls of at least hemispherical shape by wet-back, making solder balls (see FIG. 3D).

By means of the above process, solder balls are formed as the external electrodes 5 (see FIG. 5). Next, processes for achieving the objectives of preventing the oxidation of the chromium (Cr) layer 16 or the like, of improving moisture resistance in the finished semiconductor device, of providing mechanical protection for the surface, and so forth, are carried out as shown in FIGS. 4A and 48.

Figure 4A:
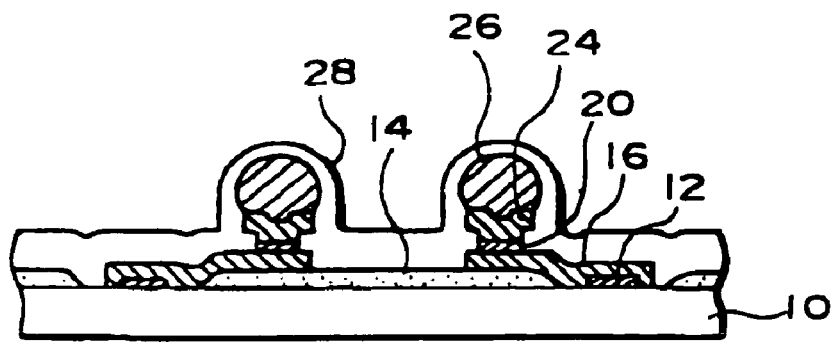
FIGS. 4A to 4C illustrate the method of making a semiconductor device being a basic of the present invention.

As shown in FIG. 4A, a photosensitive solder resist layer 28 is formed by application over the whole surface of the wafer 10. Then, by carrying out exposure, development, and firing processes, the portion of the solder resist layer 28 covering the solder 26 and the neighboring region is removed. In this way, the remaining solder resist layer 28 acts as a film for preventing oxidation, and as a protective film in the finished semiconductor device, and further forms a protective layer for the purpose of improving moisture resistance. Next a test for electrical characteristics is carried out, and if required, a product number and manufacturer's name are printed.

Figure 4B:
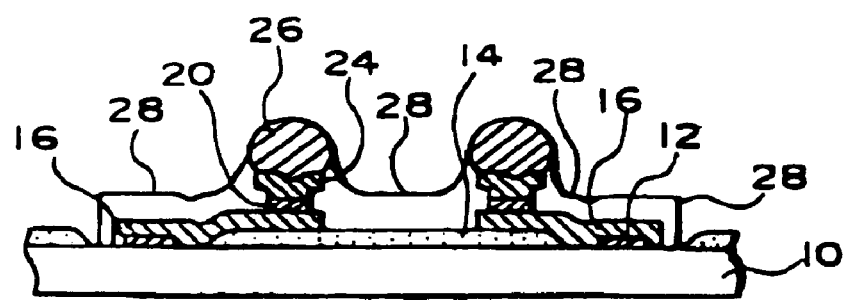
Figure 4C:
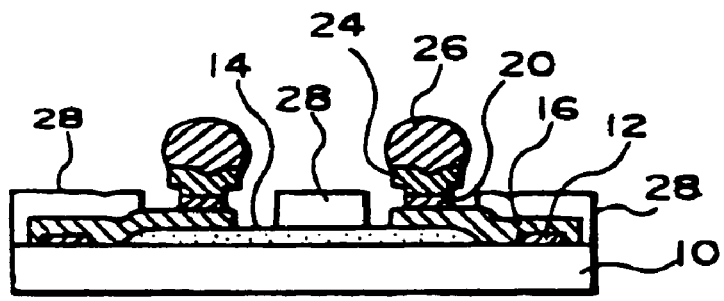

Next, dicing is carried out, and as shown in FIG. 4C, individual semiconductor devices are separated. Here, the dicing position, as will be clear from a comparison of FIGS. 4B and 4C, is such as to avoid the resin layer 14. As a result, since dicing is carried out only on the wafer 10, problems involved in cutting through a number of layers of different materials can be avoided. The dicing process is carried out by a conventional method.

With a semiconductor device formed in this way, the resin layer 14 forms a stress relieving layer 7 (see FIG. 5), and therefore stress occurring because of differences in coefficients of thermal expansion between a circuit board (not shown in the drawings) and the semiconductor chip 1 (see FIG. 5) is alleviated.

According to the above described method of making a semiconductor device, almost all steps are completed within the stage of wafer processing. In other words, the step in which the external terminals for connection to the board on which mounting is to take place is carried out within the stage of wafer processing, and it is not necessary to carry out the conventional packaging process, such as an inner lead bonding process and external terminal formation process for each individual semiconductor chip, in which individual semiconductor chips are handled. Besides, when the stress relieving layer is formed, a substrate such as a patterned film is not required. For these reasons, a semiconductor device of low cost and high quality can be obtained.

In this example, as the resin of the stress relieving layer is used a photosensitive polyimide resin, but alternatively a nonphotosensitive resin may also be used. Besides, in this example, there may be two or more wiring layers. Generally, when layers are superimposed the layer thickness increases, and the wiring resistance can be reduced. In particular, when one layer of the wiring is of chromium (Cr), since copper (Cu) or gold has a lower electrical resistance than chromium (Cr), a combination makes it possible to reduce the wiring resistance. Alternatively, a titanium layer may ba formed on the stress relieving layer, and on this titanium layer a nickel layer or a layer of platinum and gold may be formed. Besides, two layers, of platinum and gold, may also be used for the wiring.

(Second Basic Art)

Figure 6A:
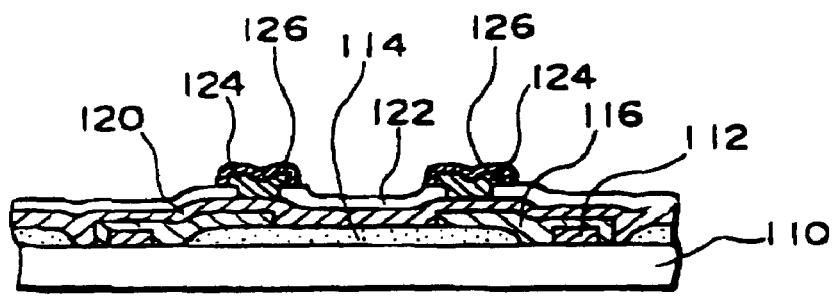
FIGS. 6A to 6C illustrate the method of making a semiconductor device being a basic of the present invention.
Figure 6B:
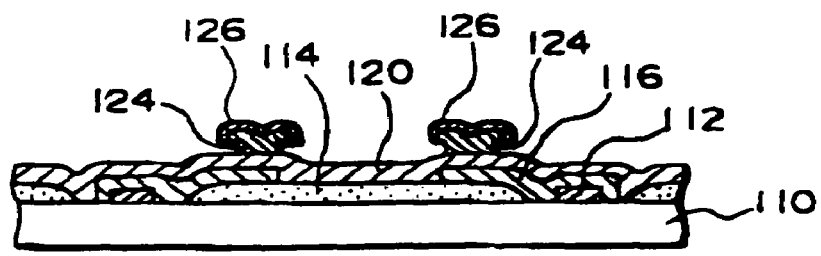

FIGS. 6A to 7C illustrate the second basic art of the method of making a semiconductor device. This art differs from the first basic art in the steps in FIG. 3A and subsequent steps, and in the steps up to FIG. 2E is the same as the first basic art. Therefore, since the wafer 110, electrodes 112, resin layer 114, chromium (Cr) layer 116, copper (Cu) layer 120, resist layer 122, and bass 124 shown in FIG. 6A are the same as the wafer 10, electrodes 12, resin layer 14, chromium (Cr) layer 16, copper (Cu) layer 20, resist layer 22, and base 124 shown in FIG. 2E, and the method of fabrication is the same as shown in FIGS. 1A to 2E, description is omitted here.

Figure 6C:
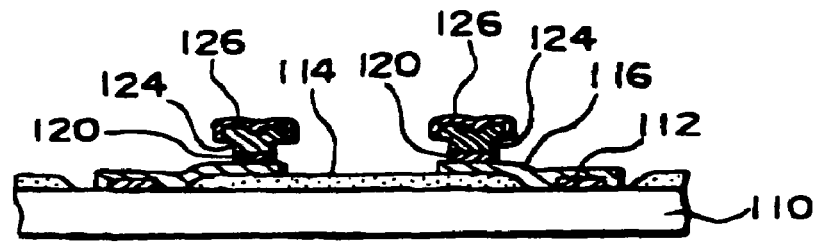

In this basic art, as shown in FIG. 6A, a thin solder 126 is formed by plating on the base 124, and the resist layer 122 is removed, as shown in FIG. 6e. Furthermore, with the thin solder 126 as a resist, as shown in FIG. 6C the copper (Cu) layer 120 is etched.

Figure 7A:
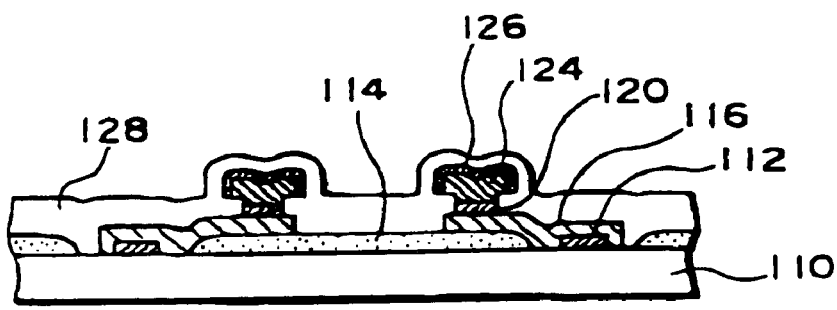
FIGS. 7A to 7C illustrate the method of making a semiconductor device being a basic of the present invention.
Figure 7B:
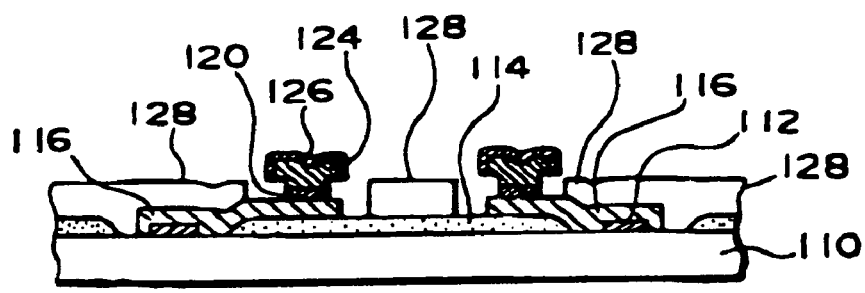

Next, as shown in FIG. 7A a solder resist layer 128 is formed over the whole surface of the wafer 110, and as shown in FIG. 78, the solder resist layer 128 in the region of the base 124 is removed by exposure, development, and firing processes.

Figure 7C:
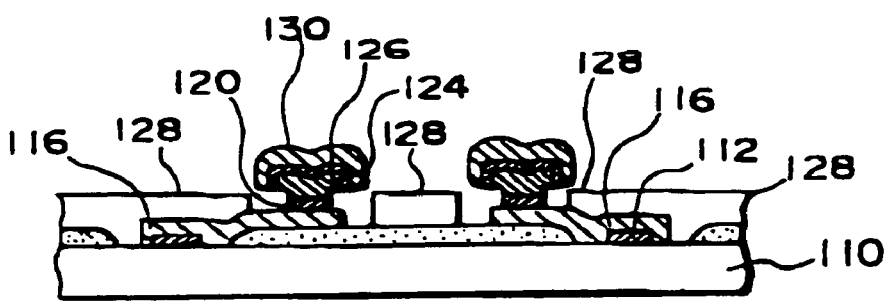

Next, as shown in FIG. 7C, on the base 124 where the thin solder 126 remains, a thick solder 129, thicker than the thin solder 126 is formed by Plating. This is carried out by electroless plating. The thick solder 129 is then subjected to wet-back whereby in the same manner as shown in FIG. 3, balls of at least hemispherical shape are formed. In this way, the thick solder 129 forms the solder balls of the external electrodes 5 (see FIG. 5). The subsequent process is the same as in the first basic art described above.

According to this basic art again, almost all steps can be carried out within the stage of wafer processing. It should be noted that in this basic art, the thick solder 129 is formed by electroless plating. As a result, the base 124 may equally be omitted, and the thick solder 129 formed directly on the copper (Cu) layer 120.

(Third Basic Art)

FIGS. 8A to 9D illustrate the third basic art of the method of making a semiconductor device.

Figure 8A:
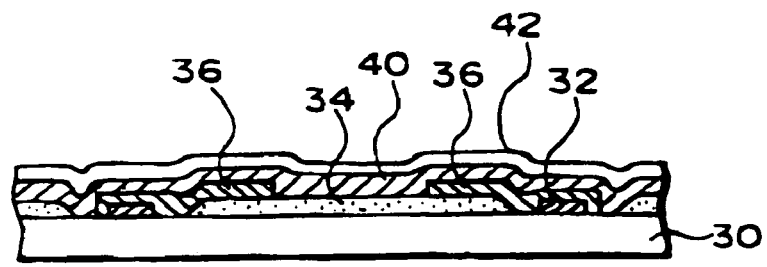
FIGS. 8A to 8D illustrate the method of making a semiconductor device being a basic of the present invention.
Figure 8B:
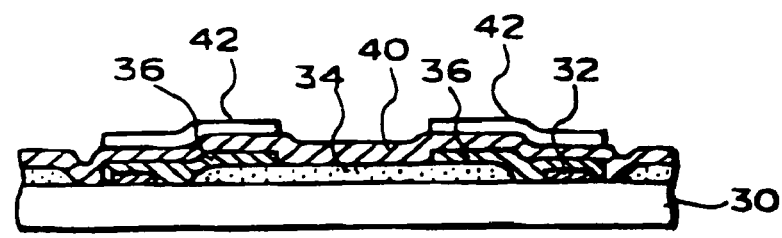

Since the water 30, electrodes 32, resin layer 34, chromium (Cr) layer 36, copper (Cu) layer 40 and resist layer 42 shown in FIG. 8A are the same as the wafer 10, electrodes 12, resin layer 14, chromium (Cr) layer 16, copper (Cu) layer 20, and resist layer 22 shown in FIG. 2C, and the method of fabrication is the same as shown in FIGS. 1A to 2C, description is omitted here.

Next, a part of the resist layer 42 shown in FIG. 8A is removed by exposure, development, and firing processes. In more detail, as shown in FIG. 8A, only the resist layer 42 positioned over the chromium (Cr) layer 36 forming the wiring is left, and in other areas the resist layer 42 is removed.

Figure 8C:
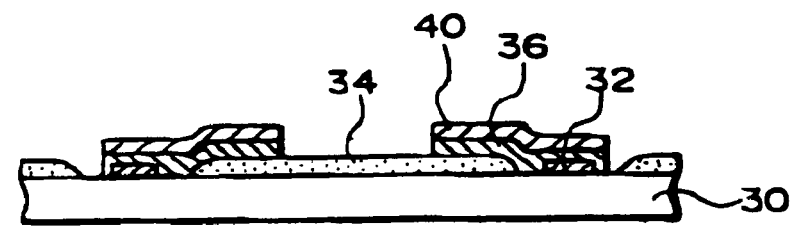
Figure 8D:
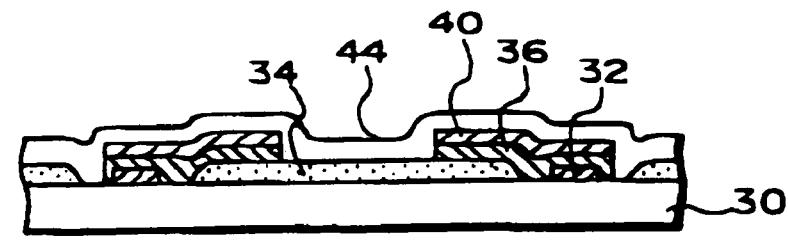

Next, the copper (Cu) layer 40 is etched and the resist layer 42 is removed, so that as shown in FIG. 8C, the copper (Cu) layer 40 is left only on the chromium (Cr) layer 36. In this way, the wiring is formed as a two-layer construction from the chromium (Cr) layer 36 and copper (Cu) layer 40.

Next, as shown in FIG. 80, a photosensitive solder resist is applied, and a solder resist layer 44 is formed.

Figure 9A:
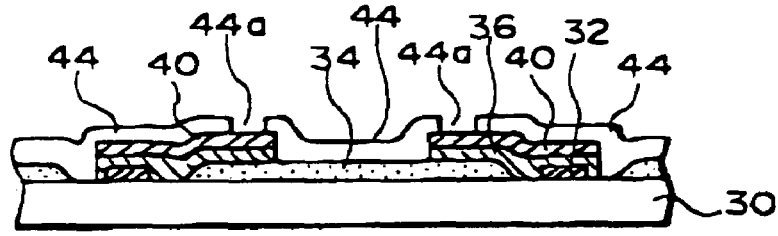

As shown in FIG. 9A, in the solder resist layer 44 are formed contact holes 44a. The contact holes 44a are formed over the resin layer 34 and over the copper (Cu) layer 40 which is the surface layer of the two-layer wiring. It should be noted that the formation of the contact holes 44a is carried out by exposure, development, and firing processes. Alternatively, the solder resist may be printed leaving holes in predetermined positions so as to form the contact holes 44a.

Next, a solder cream 46 is printed in the contact holes 44a to form a raised shape (see FIG. 5B). The solder cream 46 is formed into solder balls by a wet-back process as shown in FIG. 9C. Next, dicing is carried out, and the individual semiconductor devices shown in FIG. 9D are obtained.

In this basic art, the base for the solder balls is omitted, and printing of a solder cream is used, simplifying the formation of the solder balls, and also reducing the number of steps in the fabrication process.

Besides, the wiring of the fabricated semiconductor device is two-layer, of chromium (Cr) and copper (Cu). Here, chromium (Cr) has good adhesion with respect to the resin layer 34 formed of polyimide resin, and the copper (Cu) has good resistance to cracks. The good resistance to cracks allows wire breaks and damage to the electrodes 32 or active elements to be prevented. Alternatively, a copper (Cu) and gold two-layer, chromium and gold two-layer, or chromium, copper (Cu), and gold three-layer wiring construction is also possible.

This basic art is an example of not using a base, however, it is evident that a base may be provided.

(Fourth Basic Art)

FIG. 10 illustrates the fourth basic art of the method of making a semiconductor device.

Since the wafer 130, electrodes 132, resin layer 134, chromium (Cr) layer 136, copper (Cu) layer 140 and solder resist layer 144 shown in this figure are the same as the wafer 30, electrodes 32, resin layer 34, chromium (Cr) layer 36, copper (Cu) layer 40 and solder resist layer 44 shown in FIG. 9A, and the method of fabrication is the same as shown in FIGS. 8A to 9A, description is omitted here.

Figure 9B:
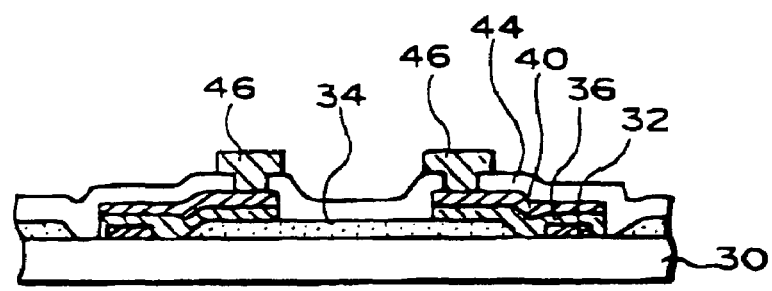
Figure 9C:
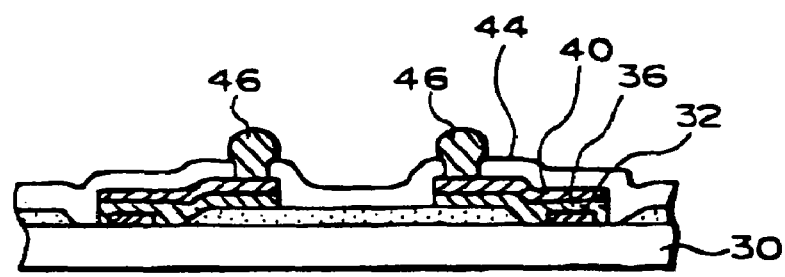
Figure 9D:
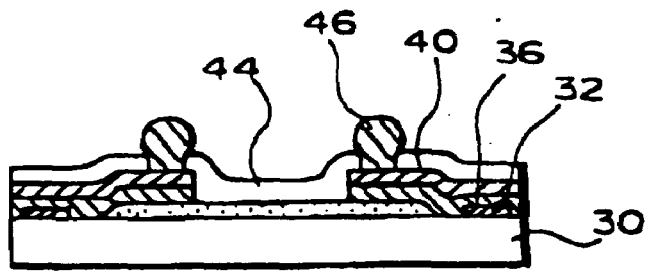

In this basic art, in place of the solder cream 46 used in FIG. 9B, flux 146 is applied to the contact holes 144a formed in the solder resist layer 144 and solder balls 148 are disposed thereon. Thereafter, a wet-back process, inspection, stamping, and dicing processes are carried out.

According to this basic art, the preformed solder balls 148 are put in place to be the external electrodes 5 (see FIG. 5). Besides, compared with the first and second basic arts, the base 24 or 124 can be omitted. Furthermore, the wires 3 (see FIG. 5) are of a two-layer construction of the chromium (Cr) layer 136 and copper (Cu) layer 140.

This basic art is an example of not using a base, however, it is evident that a base may be provided.

(Fifth Basic Art)

FIGS. 11A to 12C illustrate the fifth basic art of the method of making a semiconductor device.

Figure 11A:
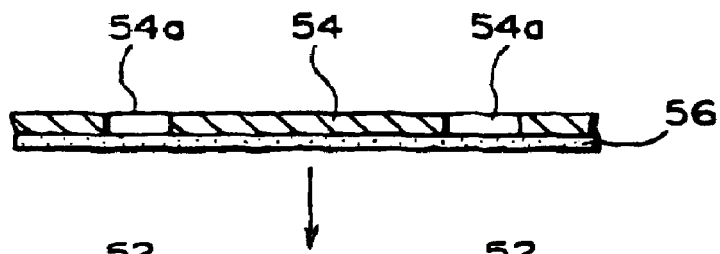
FIGS. 11A to 11D illustrate the method of making a semiconductor device being a basic of the present invention.

First, as shown in FIG. 11A, a glass plate 54 is adhered to a wafer 50 having electrodes 52. In the glass plate 54 are formed holes 64a corresponding to the electrodes 52 of the wafer 50, and an adhesive 56 is applied.

The coefficient of thermal expansion of the glass plate 54 has a value between the coefficient of thermal expansion of the wafer 54 forming the semiconductor chip and the coefficient of thermal expansion of the circuit board on which the semiconductor device is mounted. Because of this, since the coefficient of thermal expansion varies in the order from the semiconductor chip obtained by dicing of the wafer 54, the glass plate 54, and the circuit board (not shown in the drawings) on which the semiconductor device is mounted, the differences in the coefficient of thermal expansion at the junctions is reduced, and the thermal stress is reduced. That is to say, the glass plate 54 acts as the stress relieving layer. It should be noted that in place of the glass plate 54 a ceramic plate may also be used, provided that it has a similar coefficient of thermal expansion.

Figure 11B:
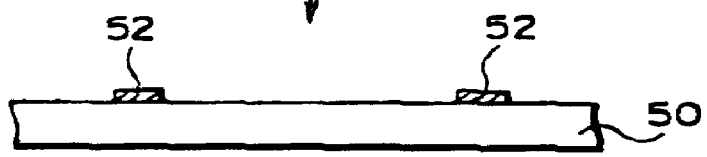

Then, when the glass plate 54 is adhered to the wafer 50, adhesive 56 which has entered the holes 54 is removed by an $O_2$ plasma process, as shown in FIG. 11B.

Figure 11C:
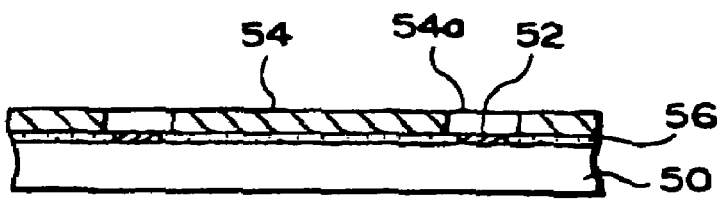
Figure 11D:
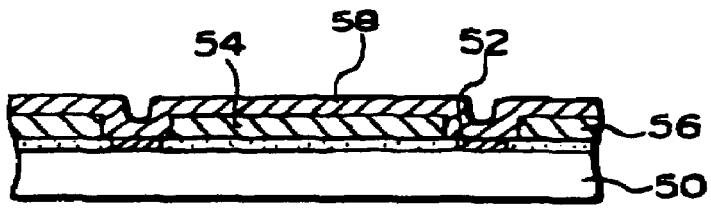
Figure 12A:
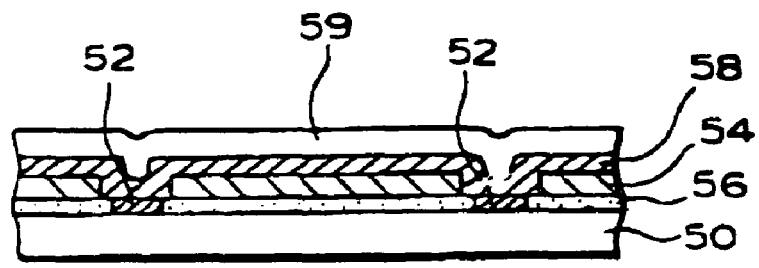
FIGS. 12A to 12C illustrate the method of making a semiconductor device being a basic of the present invention.
Figure 12B:
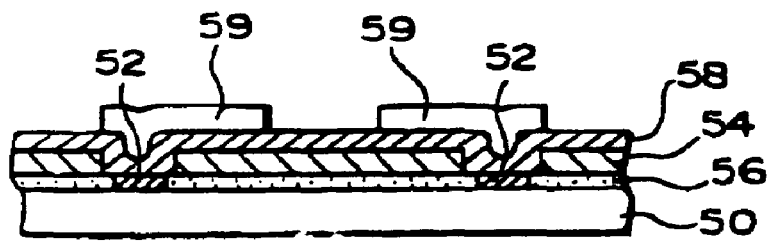

Next, as shown in FIG. 11C, on the glass plate 54, being the whole surface of the wafer 50, an aluminum layer 58 is formed by sputtering. Thereafter, if a film is formed on the surface of the hole(s) 54 the aluminum, which is susceptible to wire breaks, can be protected. Next, as shown in FIG. 12A a resist layer 59 is formed, and as shown in FIG. 12B, exposure, development, and firing processes are used to remove a part of the resist layer 59. The part of the resist layer 59 removed is preferably the area other than the portion where the wiring pattern is formed.

In FIG. 12B, the resist layer 59 is left extending from over the electrodes 52 to over the glass plate 54. Besides, it is separated so as not to connect from over one electrode 52 to over another electrode 52.

Figure 12C:
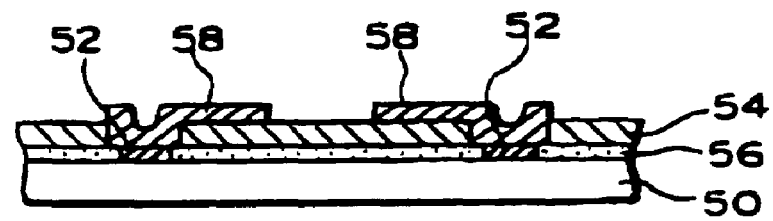

Next, when the aluminum layer 58 is etched, as shown in FIG. 12C, the aluminum layer 58 is left in the region to form the wiring. That is to say, the aluminum layer 58 extends from the electrodes 52 over the glass plate 54 to form the wiring. Besides, the aluminum layer 58 is formed so that individual electrodes 52 are not electrically connected to each other, and the wiring is provided for each electrode 52 separately. Alternatively, if it is necessary for a plurality of electrodes 52 to be electrically connected together, the aluminum layer 58 may be formed so as to provide the corresponding wiring It should be noted that for the wiring, in place of the aluminum layer 58, any of the materials selected in the first basic art may also be applied.

By means of the above process, since the wiring from the electrodes 52 is formed, solder balls are formed on the aluminum layer 58 being the wiring, and individual semiconductor devices are cut from the wafer 50. These steps can be carried out in the same way as in the first basic art.

According to this basic art, the glass plate 54 has holes 54a, but the formation of the holes 54a is easy. Therefore, with respect to the glass plate 54 patterning beforehand to form bumps or wiring is not necessary. Besides, for the steps, such as that of forming the aluminum layer 58 being the wiring, technology of forming a metal thin film in wafer processing is applied, and almost all steps are completed within the stage of wafer processing.

It should be noted that on the glass plate 54, a separate stress absorbing layer, such as polyimide resin, may be provided as in the first basic art. In this case, since the stress absorbing layer is once again provided, the coefficient of thermal expansion of the glass plate 54 may be the same as that of silicon.

(Sixth Basic Art)

FIGS. 13A to 13D illustrate the sixth basic art of the method of making a semiconductor device. In this example, a polyimide plate is selected as the stress relieving layer.

This is because polyimide has a low Young's modulus, and is therefore a suitable material for the stress relieving layer. It should be noted that alternatively, for example, a plastic plate or glass epoxy or similar composite plate may be used. In this case, it is preferable to use the same material as the mounting board whereby the difference in the coefficient of thermal expansion is removed. In particular, since at present the use of a plastic substrate as the mounting board is common, it is effective to use a plastic plate as the stress relieving layer.

Figure 13A:
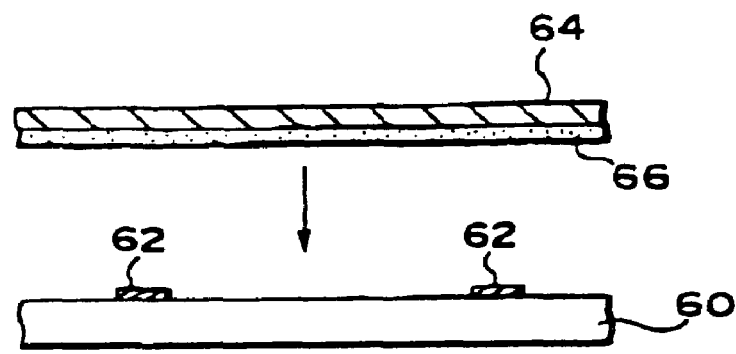
FIGS. 13A to 13D illustrate the method of making a semiconductor device being a basic of the present invention.
Figure 13B:
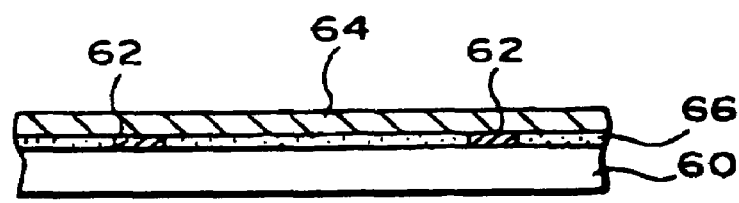

First, as shown in FIG. 13A, a polyimide plate 64 is adhered to a wafer 60 having electrodes 62, as shown in FIG. 13B. It should be noted that an adhesive 66 has been previously applied to the polyimide plate 64.

Figure 13C:
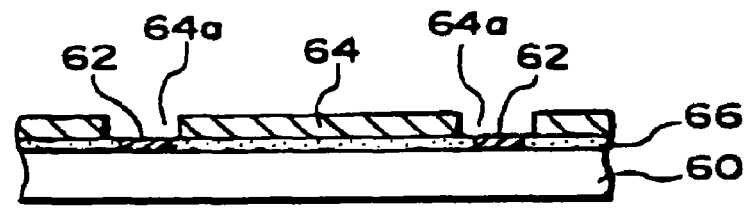
Figure 13D:
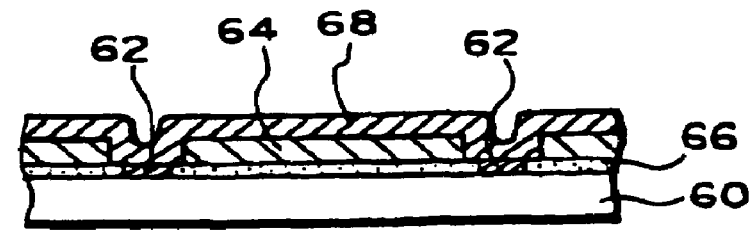

Next, as shown in FIG. 13C, in the region corresponding to the electrodes 62, contact holes 64a are formed, using for example an excimer laser, and as shown in FIG. 13D, an aluminum layer 68 is formed by sputtering. It should be noted that in place of the aluminum layer 68, any of the materials selected in the first basic art-may also be applied.

In this way, the same state as shown in FIG. 11C is reached, and therefore thereafter by carrying out the steps in FIG. 12A and subsequent figures, the semiconductor device can be fabricated.

According to this basic art, since a polyimide plate 64 without even any holes being formed is used, a patterned substrate is not required. Other benefits are the same as for the first to fifth basic arts described above.

As another basic art, the stress relieving layer may have holes formed mechanically by predrilling or similar means, and a positioning process may be used for subsequent alignment on the wafer. It is also possible to provide the holes by non-mechanical means, such as chemical etching or dry etching. It should be noted that if holes are formed by chemical etching or dry etching, this may be carried out on the wafer in a previous preparatory step.

First Embodiment

The present invention seeks to further improve on the above described basic art, and the present invention is now described in terms of a number of preferred embodiments, with reference to the drawings.

FIGS. 14A to 14D illustrate a first embodiment of the present invention.

Figure 14A:
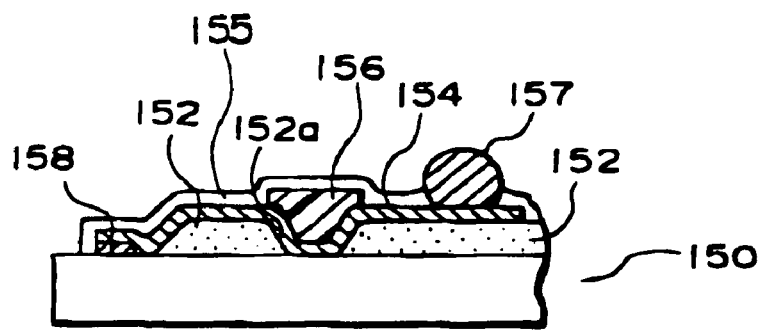
FIGS. 14A to 14D illustrate a first embodiment of the semiconductor device of the present invention.

In the semiconductor device 150 shown in FIG. 14A, a resin layer 152 of polyimide is formed discontinuously. The resin layer 152 forms a stress relieving layer. As a stress relieving layer, photosensitive polyimide resin is preferable, but a nonphotoaensitive resin may also be used. A material such as a silicone denatured polyimide resin, an epoxy resin, or a silicone denatured epoxy resin that has a stress relieving function having a low Young's modulus (not exceeding $1 \times 10^{16}$ Pa) when solidified may be used.

Besides, in the resin layer 152 is formed a tapered depression 152a. Then wiring 154 is formed along the surface shape of the depression 152a, as a result of which, the wiring 154 is bent in cross-section. It should be noted that on the wiring 154 is formed a solder ball 157. In this way, as the wiring 154 is laid out an the resin layer 152 which acts as a stress relieving layer, and being bent, it expands and contracts more easily than if simply flat. Therefore, when the semiconductor device 150 is mounted on a circuit board, the stresses generated by differences in the coefficient of thermal expansion can be more easily absorbed. From the position where the wiring 154 is displaced (the bent portion and the like) to the solder ball 157, it is preferable that as the resin layer 152 is selected a material with a larger elastic deformation ratio. This point applies in common to the following embodiments.

Further, over the depression 152a, or more precisely in the wiring region formed in a depression in a position corresponding to the depression 152a, as shown in FIG. 14A, it is preferable for an elastic body 156 to be provided. The elastic body 156 may be formed of the material used for the resin layer 152 forming the stress relieving layer. By means of this elastic body 156, the stress of the expansion and contraction of the wiring 154 can be further absorbed. The function of the elastic body 156 may be combined with the outermost layer (protective layer) formed by, for example, photoresist. Besides, the elastic body 156 may be provided separately for each depression 152a.

In this way, breaks in the wiring 154 are prevented, and also damage to electrodes 158 and the like by stress transmitted through the wiring 154 is prevented. It should be noted that the electrodes 158 and wiring 154 are protected by being covered by the outermost layer (protective layer) 155.

Figure 14B:
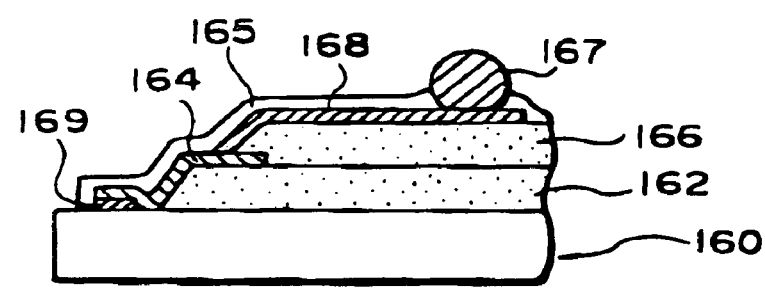

Next, in the semiconductor device 160 shown in FIG. 14B, on the portion of first wiring 164 formed from an electrode 169 over a first resin layer 162 which is over the first resin layer 162, a second resin layer 166 and second wiring 168 are formed. The first wiring 164 is connected to the electrode 169 and the second wiring 168 is connected to the first wiring 164, and on the second wiring 168 is formed a solder ball 167. In this way, by forming a multi-layer structure of resin layers and wiring, the flexibility of wiring design is increased. It should be noted that the electrode 169 and wiring 164 and 168 are protected by being covered by the outermost layer (protective layer) 165.

Further, wiring fine enough to have a negligible area may be formed with a planar enlargement (width or size). Besides, when the resin layer consists of a plurality of layers the stress can be more easily distributed. If tis wiring given a planar form is at ground potential or power supply potential, impedance control is made easier, and high frequency characteristics are excellent.

Figure 14C:
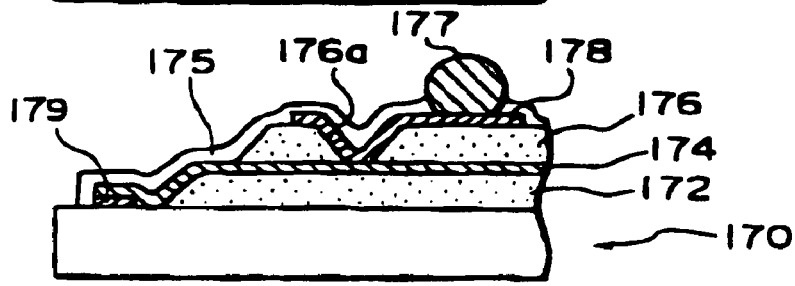

Next, the semiconductor device 170 shown in FIG. 14C is a combination of the above described semiconductor devices 150 and 160. That is to say, on a first resin layer 172 is formed first wiring 174, and on the first wiring 174, a second resin layer 176 is formed so as to have a depression 176a. Then second wiring 178 formed on the second resin layer 176 is formed so as to have a bent shape in cross-section. It should be noted that on the second wiring 178 is formed a solder ball 177. Besides, an electrode 179 and wiring 174 and 178 are protected by being covered by the outermost layer (protective layer) 175. According to this embodiment, the combined advantage of the above described semiconductor devices 150 and 160 is achieved.

Figure 14D:
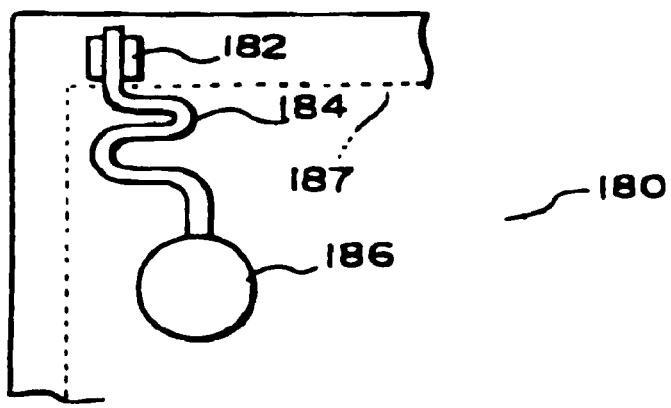

Next, in the semiconductor device 180 shown in FIG. 14D, on a stress relieving layer 187 formed in the region shown by a broken line, wiring 184 is formed to be bent in a planar form from an electrode 182, and on the wiring 184 is formed a bump 186 as a solder ball or the like. In this embodiment also, although the orientation is different from that of the above described semiconductor device 150 (see FIG. 14A), since the wiring 184 is bent, it has excellent stress absorbing ability.

It should be noted that the wiring 184 shown in FIG. 14D as bent in the plane may equally be bent in relief, as shown in FIGS. 14A to 14C. By doing this, the effectiveness for preventing wire breakages is even further increased. However, it is essential that the stress relieving layer 187 is present under the wiring 184. Besides, electrode 182 and wiring 184 are protected by being covered by the outermost layer (protective layer) not shown in the drawing.

Second Embodiment

Figure 15:
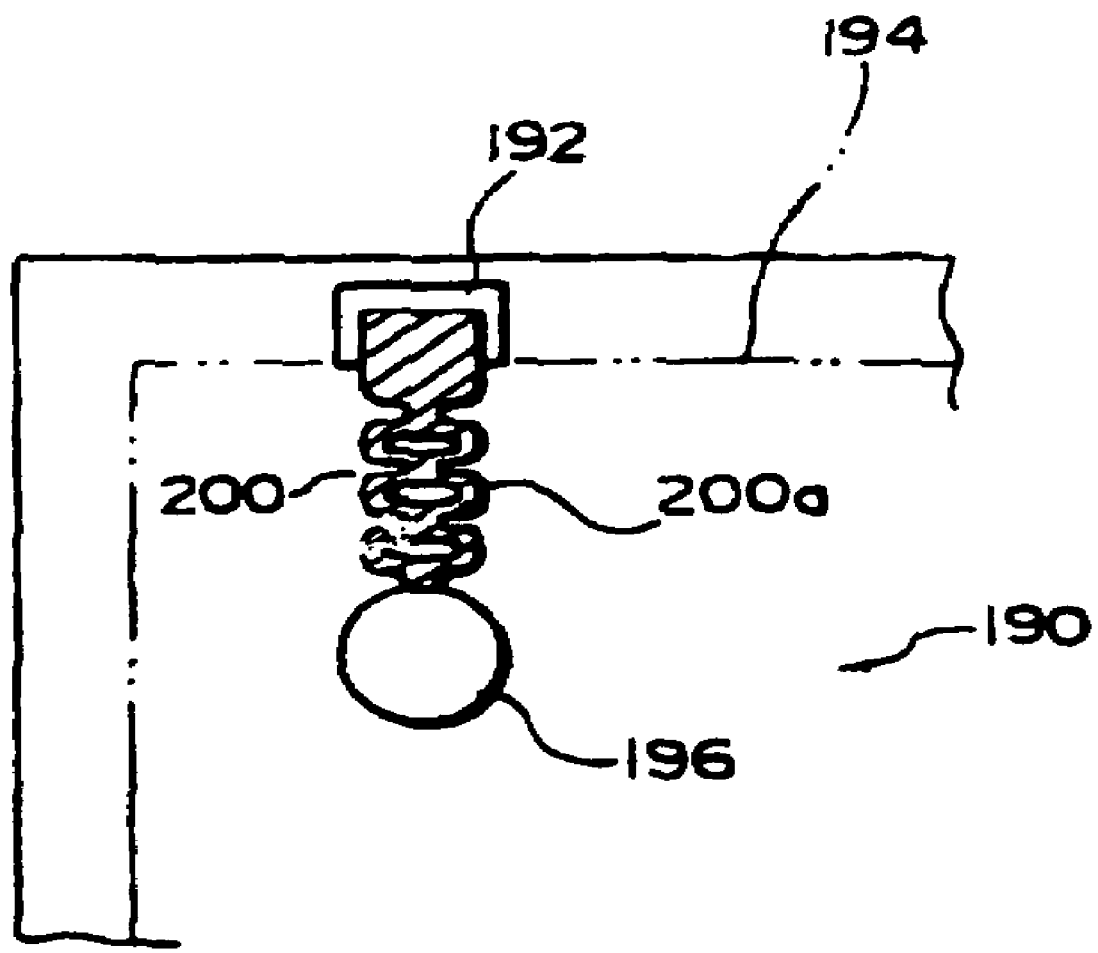
FIG. 15 illustrates a second embodiment of the semiconductor device.

Next, the semiconductor device 190 shown in FIG. 15 is characterized by wiring 200 connecting an aluminum pad 192 and a solder ball 196 provided on a stress relieving layer 194. For the wiring 200 may be used any of the wiring materials selected for the first basic art and the like. This wiring 200 has a bellows-like portion 200a. The bellows-like portion 200a, as shown in FIG. 14D, is in a state that wire includes a slit and a plurality of the bellows-like portion 200a is continuously formed between normal wiring. The bellows-like portion 200a has better stress-absorbing properties than the bent wiring 184. By the provision of the bellows-like portion 200a, the occurrence of cracks in the wiring 200 on the semiconductor chip, and damage to the aluminum pad 192 and other active elements is eliminated, and the reliability of the semiconductor device is increased. Besides, since the bellows-like portion 200a is provided in a single wiring, the space required for the stress absorbing construction is very small. By this means, the semiconductor device can be kept compact, remaining in the CSP category, while the design freedom can be increased. It should be noted that in this embodiment, the bellows-like portion 200a is provided in the horizontal plane direction, but equally this may be provided, in the thickness direction.

In the above described embodiments and basic art solder has been given as an example for the external electrodes, but as other examples, gold bumps may be used, or any other materials well known in the art may be used without any problem. Besides, external electrodes may be formed anywhere on the active surface of the semiconductor chip as long as they are not over the electrodes.

Third Embodiment

Figure 16:
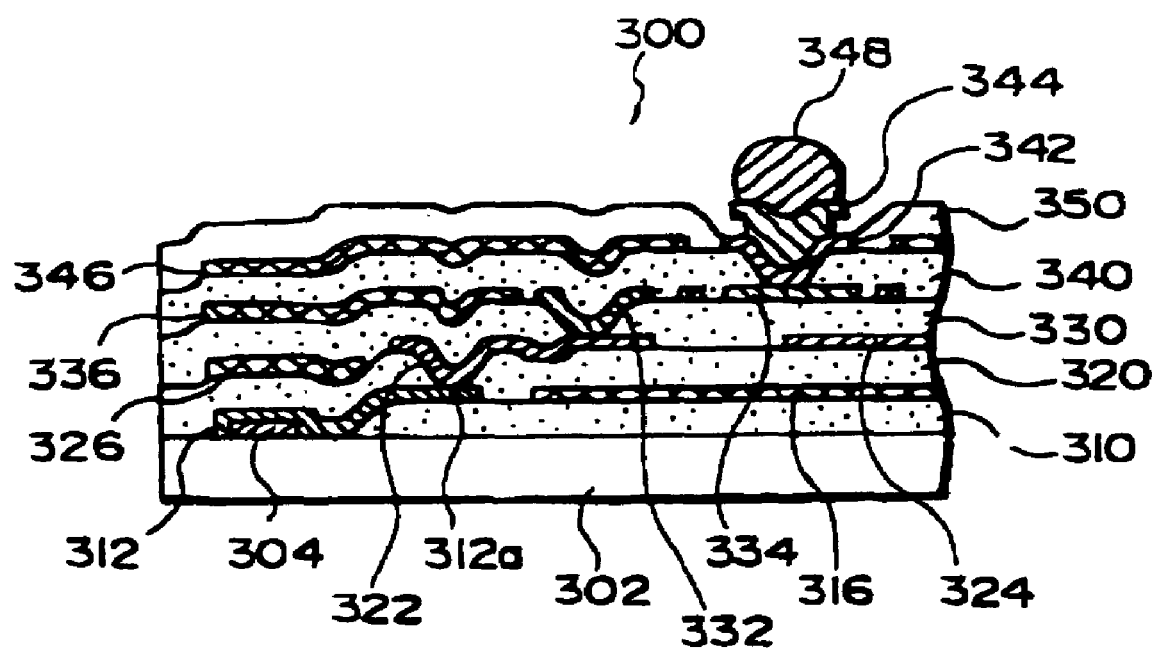
FIG. 16 illustrates a third embodiment of the semiconductor device.

FIGS. 16 to 20 show a third embodiment of the present invention. FIG. 16 shows a cross-section of the semiconductor device of this embodiment. A semiconductor device 300 has a semiconductor chip 302 on which is a multi-layer structure (four layers), and the surface being protected by a solder resist 350. It should be noted that in this embodiment also, materials and manufacturing method, and so on described in other embodiments and in the basic art, may also be applied.

Figure 17A:
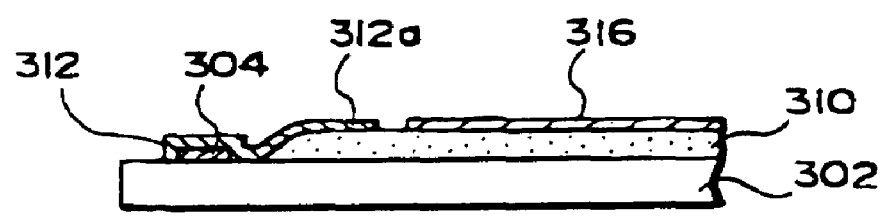
FIGS. 17A and 17B illustrate the third embodiment of the method of making a semiconductor device.
Figure 17B:
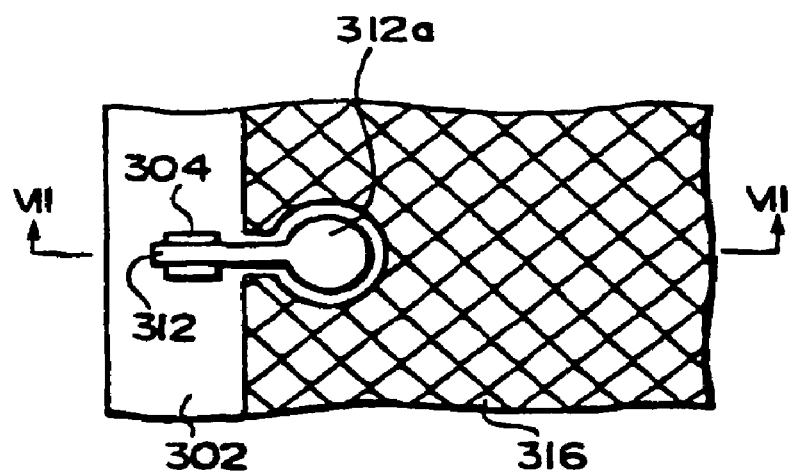

FIGS. 17A and 17B show the first layer. In more detail, FIG. 17B is a plan view and FIG. 17A is a cross-sectional view along the line VII-VII in FIG. 178. The semiconductor chip 302 has an electrode 304 which inputs or outputs a signal. A stress relieving layer 310 is formed to be inclined at the end thereof, in the vicinity of the electrode. The stress relieving layer 310 is an insulator, and in particular a polyimide resin is preferable. Next, signal wiring 312 is formed from the electrode 304 to over the stress relieving layer 310. The signal wiring 312, as shown in FIG. 17B, has a connection portion 312a in the form of an island at the end opposite to the electrode 304. Besides, surrounding this connection portion 312a but not coming into contact therewith is formed a ground plane 316. The ground plane 316 is connected to a grounding electrode (not shown in the drawing) of the semiconductor chip 302.

Figure 18A:
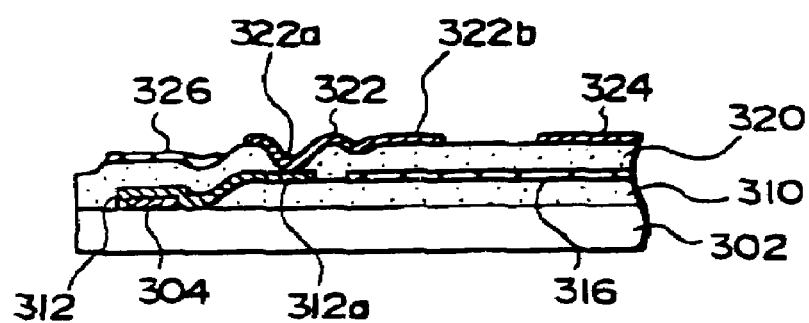
FIGS. 18A and 18B illustrate the third embodiment of the method of making a semiconductor device.
Figure 18B:
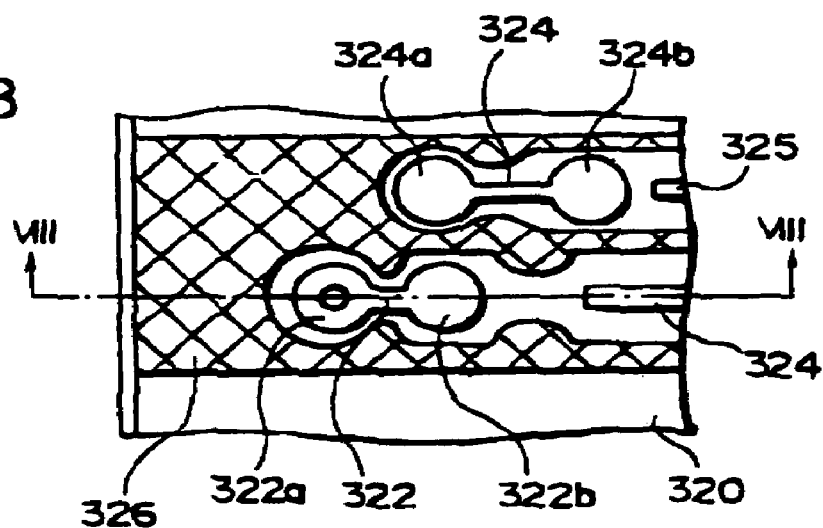

FIGS. 18A and 18B show the second layer. In more detail, FIG. 18B is a plan view and FIG. 18A is a cross-sectional view along the line VIII-VIII in FIG. 18B. As shown in these figures, a stress relieving layer 320 is formed over the first layer described above. However, the stress relieving layer 320 is formed so as to avoid the center portion of the connection portion 312a of the signal wiring 312 of the first layer. Then signal wiring 322 is formed from the connection portion 312a of the first layer to over the stress relieving layer 320 for the second layer The signal wiring 322 has a connection portion 322a connecting to the connection portion 312a, and another connection portion 322b. Besides, on the stress relieving layer 320 is formed signal wiring 324 not electrically connecting to the signal wiring 322. The signal wiring 324 has connection portions 324a and 324b. Further on the stress relieving layer 320 is formed other wiring 324 and 325, but this is not related to the present invention, and description is omitted here. Besides, surrounding signal wiring 322 and 324 and wiring 324 and 325 but not coming into contact therewith is formed a ground plane 326. The ground plane 326 is connected to a grounding electrode (not shown in the drawing) of the semiconductor chip 302 through the ground plane 316 of the first layer.

Figure 19A:
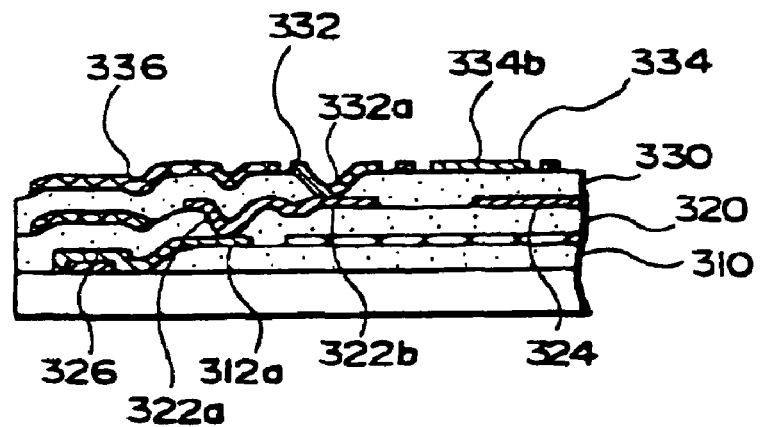
FIGS. 19A and 19B illustrate the third embodiment of the method of making a semiconductor device.
Figure 19B:
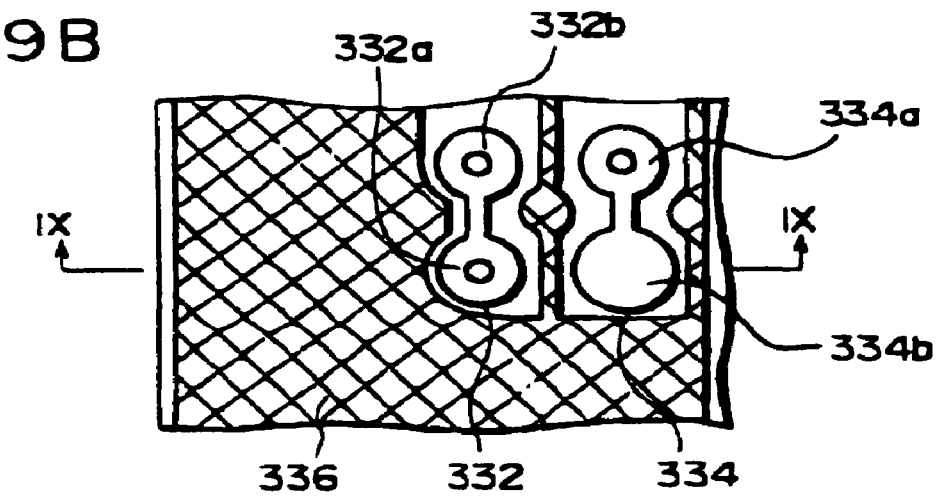

FIG. 19A and 19B show the third layer. In more detail, FIG. 198 is a plan view and FIG. 19A is a cross-sectional view along the line IX-IX in FIG. 19B. As shown in these figures, a stress relieving layer 330 is formed over the second layer described above. However, the stress relieving layer 330 is formed so as to avoid the center portion of the connection portion 322b of the signal wiring 322 of the second layer. Then signal wiring 332 is formed from the connection portion 322b of the second layer to over the stress relieving layer 330. The signal wiring 332 has a connection portion 332a connecting to the second layer connection portion 322b, and another connection portion 332b. Further, on the stress relieving layer 330 is formed signal wiring 334 not electrically connecting to the signal wiring 332. The signal wiring 334 has connection Portions 334a and 334b. Besides, surrounding signal wiring 332 and 334 but not coming into contact therewith is formed a ground plane 336. The ground plane 336 is connected to a grounding electrode (not shown in the drawing) of the semiconductor chip 302 through the ground plane 316 of the first layer and the ground plane 326 of the second layer.

Figure 20A:
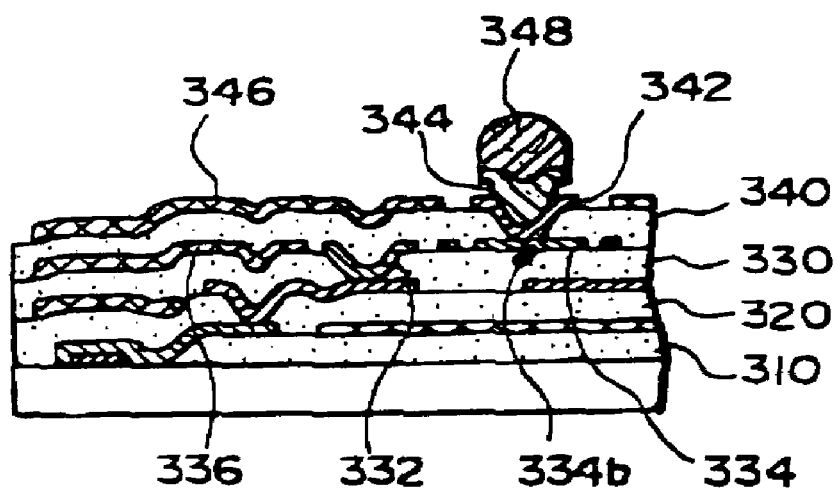
FIGS. 20A and 20B illustrate the third embodiment of the method of making a semiconductor device.
Figure 20B:
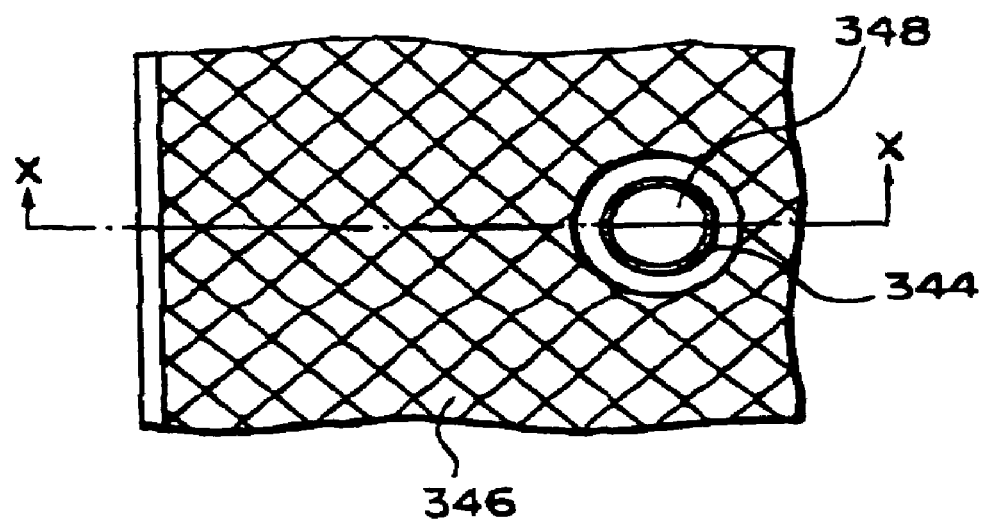

FIG. 20A and 20B show the fourth layer. In more detail, FIG. 20B is a plan view and FIG. 20A is a cross-sectional view along the line X-X in FIG. 20B. As shown in these figures, a stress relieving layer 340 is formed over the third layer described above. However, the stress relieving layer 340 is formed so as to avoid the center portion of the connection portion 334b of the signal wiring 334 of the third layer. Then a connection portion 342 is formed over the connection portion 334b of the third layer, and on this connection portion 342 is formed a base 344 of copper (Cu), and a solder ball 348 is formed on the base 344. The solder ball 348 forms an external electrode. Besides, surrounding the connection portion 342 but not coming into contact therewith is formed a ground, plane 346. The ground plane 346 is connected to a grounding electrode (not shown in the drawing) of the semiconductor chip 302 through the ground plane 316 of the first layer, the ground plane 326 of the second layer, and the ground plane 336 of the third layer.

Next, the conductivity state of this embodiment is described. The electrode 304 formed on the semiconductor chip 302 is connected to signal wiring 312 of the first layer, and this signal wiring 312 is connected to signal wiring 322 of the second layer. This signal wiring 322 is connected through its connection portion 322b to signal wiring 332 of the third layer, and this signal wiring 332 is connected through its connection portion 332b to signal wiring 324 of the second layer. The signal wiring 324 is connected through its connection portion 324b to signal wiring 334 of the third layer. Then the solder ball 348 is formed at the connection portion 334b, with the connection portion 342 and base 344 interposed therebetween.

In this way, the electrode 304 formed at a certain position on the semiconductor chip for the purpose of inputting or outputting a signal is connected to the solder ball 348 which acts as an external electrode formed at a certain position on the semiconductor chip.

Naturally, as mentioned in the other embodiments and basic art, the external electrodes may be disposed in a matrix.

Besides, the ground planes 316, 326, 336, and 346 of the first to fourth layers are all at the same ground potential.

Therefore, according to this embodiment, the wiring between the electrode 304 and the solder ball 348 is surrounded by conductors at ground potential, with insulation interposed therebetween. In other words, the internal conductor is surrounded by external conductors at ground potential, with insulation interposed therebetween, thus such a construction is the same as that of coaxial cable. By this means, signals are less susceptible to the influence of noise, and an ideal transmission path is obtained. Also, for example, if the semiconductor device is a CPU, high-frequency operation, exceeding 1 GHZ, is possible.

It should be noted that in order to reduce the cost of fabricating the layers, either of the ground planes 316 and 346 formed in the first and fourth layers may be omitted.

Other Embodiments

The present invention is not restricted to the above described embodiments, and various modifications are possible. For example, the above described embodiments apply the present invention to a semiconductor device, but the present invention can be applied to various electronic components for surface mounting, whether active or passive.

Figure 21:
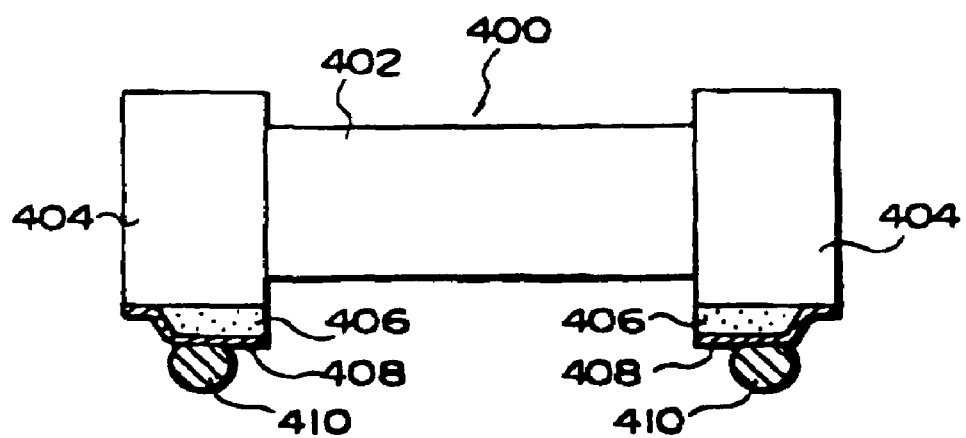
FIG. 21 shows an example of the present invention applied to an electronic component for surface mounting.

FIG. 21 shows an example of a electronic component for surface mounting to which the present invention is applied. In this figure, an electronic component 400 has a chip portion 402 at both ends of which are provided electrodes 404, and for example, this may be a resistor, capacitor, coil, oscillator, filter, temperature sensor, thermistor, varistor, variable resistor, or fuse. The electrodes 404 have wiring 408 formed with a stress relieving layer 406 interposed therebetween, in the same way as in the embodiments described above. On this wiring 408, bumps 410 are formed.

Figure 22:
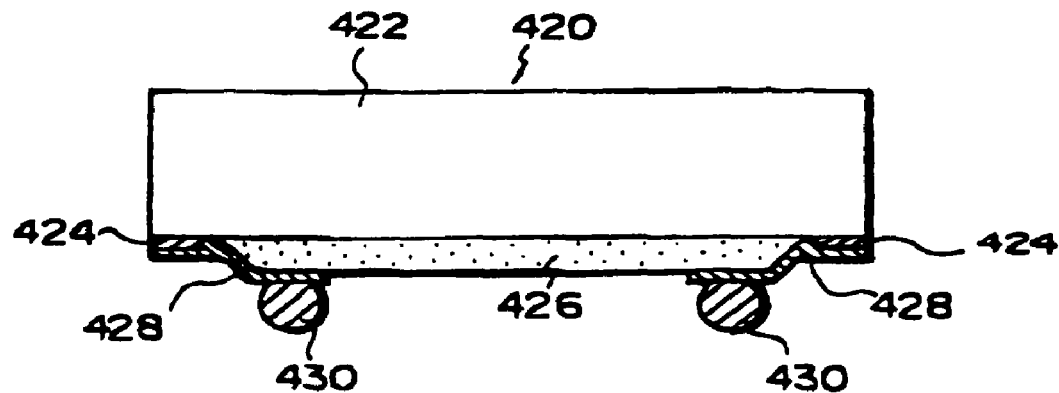
FIG. 22 shows an example of the present invention applied to an electronic component for surface mounting.

Besides, FIG. 22 also shows an example of a electronic component for surface mounting to which the present invention is applied. This electronic component 420 has electrodes 424 formed on the mounting surface of a chip portion 422, and wiring 42a formed with a stress relieving layer 426 interposed. On this wiring 428, bumps 430 are formed.

It should be noted that the method of fabrication of these electronic components 400 and 420 is the same as in the above described embodiments and basic art, and therefore description is omitted here. Besides, benefit obtained by formation of the stress relieving layers 406 and 426 is the same as in the above described embodiments and basic art.

Figure 23:
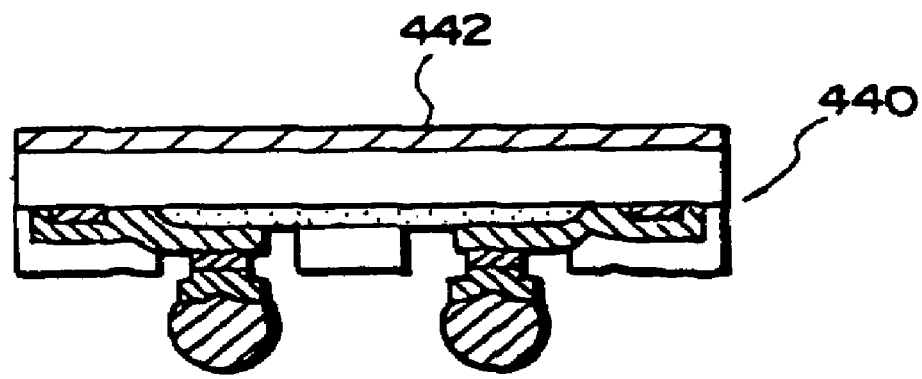
FIG. 23 shows an example in which a protective layer is formed on a semiconductor device to which the present invention is applied.

Next, FIG. 23 shows an example in which a protective layer is formed on a semiconductor device to which the present invention is applied. A semiconductor device 440 shown in this figure is the semiconductor device shown in FIG. 4C on which a protective layer 442 is formed, and since this is the same as the semiconductor device shown in FIG. 4C except for the protective layer 442, description is omitted here.

The protective layer 442 of the semiconductor device 440 is formed on the side opposite to the mounting surface, that is to say, on the rear surface. By so doing, the rear surface can be protected from damage.

Furthermore, damage to the semiconductor chip itself caused by cracks initiated by damage to the rear surface can be prevented.

The protective layer 442 is preferably formed on the rear surface of the wafer before cutting into individual semiconductor devices 440. If this is done, a plurality of semiconductor devices 440 can have the protective layer 442 formed simultaneously. In more detail, it is preferable that after the process of forming a metal thin film is completed, the protective layer 442 is formed on the wafer. By so doing, the process of forming a metal thin film can be carried out smoothly.

The protective layer 442 is preferably of a material which can withstand the high temperature of the reflow process of the semiconductor device 440. In more detail, it is preferable that it can withstand the temperature which is the melting point of the solder. Besides, the protective layer 442 may be formed by application of a potting resin. Alternatively, the protective layer 442 may be formed by attaching a sheet having either tackiness or adhesion. This sheet may be either organic or inorganic.

In this way, since the surface of the Semiconductor LO device is covered with a substance other than silicon, for example, the marking qualities are improved.

Figure 24:
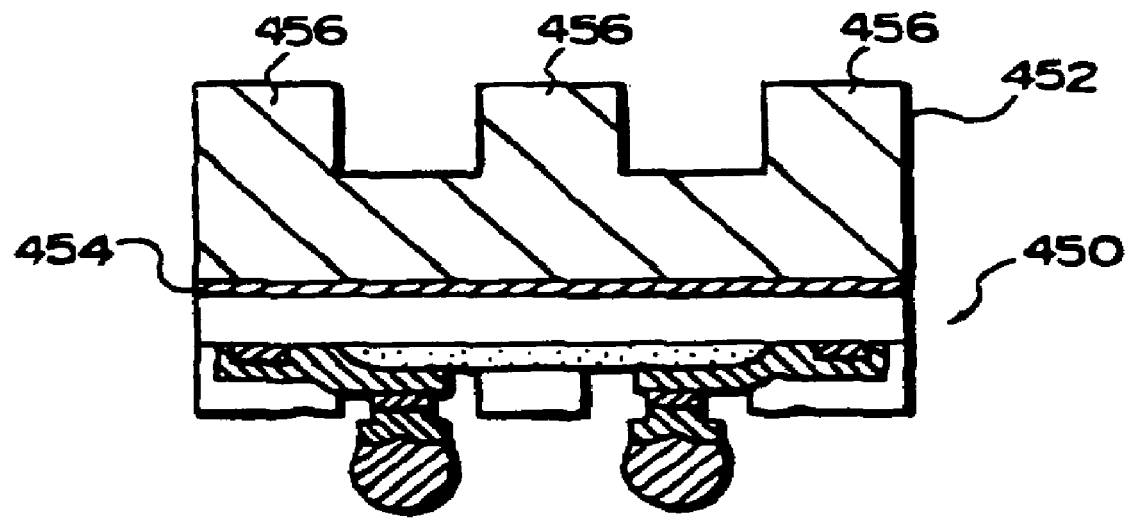
FIG. 24 shows an example in which a radiator is provided on the semiconductor device to which the present invention is applied.

Next, FIG. 24 shows an example in which a radiator is fitted to a semiconductor device to which the present invention is applied. A semiconductor device 450 shown in this figure is the semiconductor device shown in FIG. 4C to which a radiator 452 is fitted, and since except for the radiator 452 this is the same as the semiconductor device shown in FIG. 4C, description is omitted here.

The radiator 452 on the semiconductor device 450 is formed on the side opposite to the mounting surface, that is to say, on the rear surface, with a thermally conducting adhesive 454 interposed. By so doing, the heat radiation properties are improved. The radiator 452 has a plurality of fins 456, and these are commonly formed of copper, copper alloy, aluminum nitride, or the like. It should be noted that in this example, an example with fins is shown, but a radiation (plate radiator) without fins may also be used to obtain an appropriate radiation effect. In this case, since a plate is simply attached, the handling is easy, and the cost can also be reduced.

In the above described embodiments and basic art, solder bumps or gold bumps are provided in advance as external terminals on the semiconductor device, but as other examples, without using solder bumps or gold bumps on the semiconductor device, for example, a base itself of copper or the like may be used for an external terminal. It should be noted that in this case, it is necessary to provide solder on the connecting portion (land) of the semiconductor device on the mounting board (motherboard) on which it is mounted before the semiconductor device is mounted.

Besides, the polyimide resin used in the above described embodiments is preferably black. By using a black polyimide resin as the stress relieving layer, operating faults when light impinges on the semiconductor chip can be avoided, and also with an increase in the durability with respect to light the reliability of the semiconductor device car, also be improved.

Figure 25:
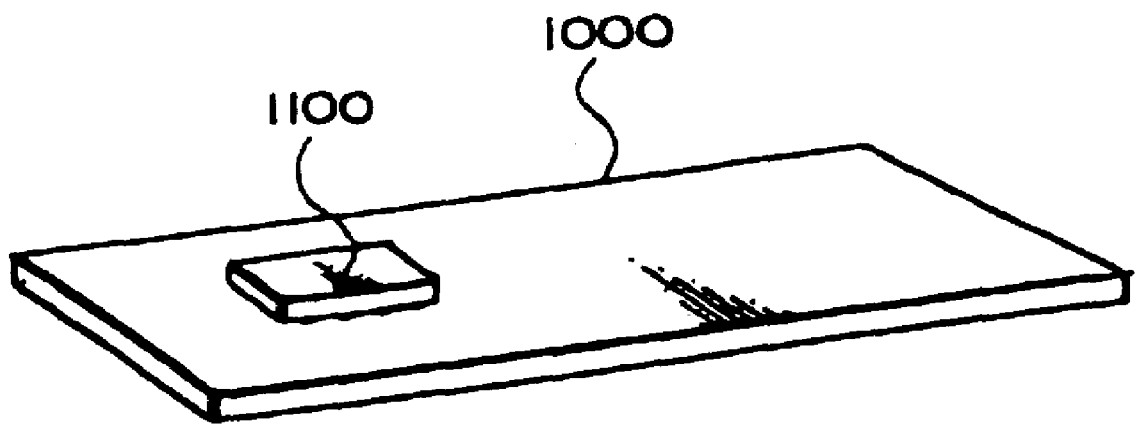
FIG. 25 shows a circuit board on which is mounted an electronic component fabricated by application of the method of the present invention.
Figure 26:
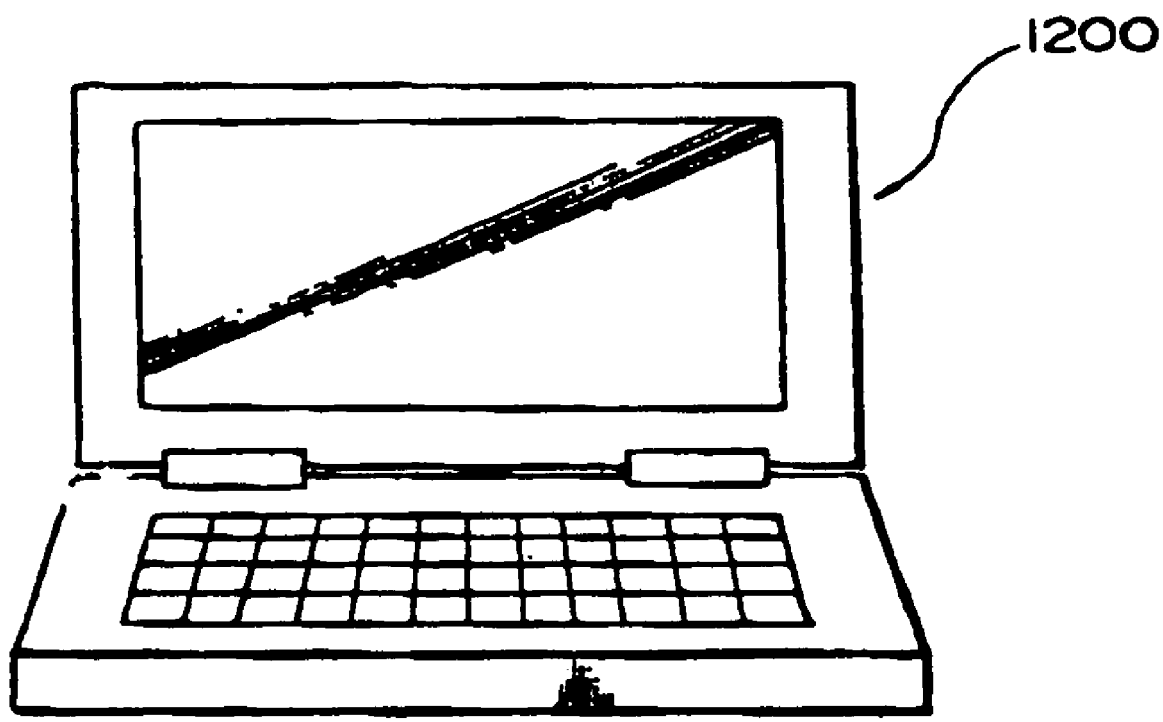
FIG. 26 shows an electronic instrument provided with a circuit board on which is mounted an electronic component fabricated by application of the method of the present invention.

In FIG. 25 is shown a circuit board 1000 on which is mounted an electronic component 1100 such as a semiconductor device fabricated according to the methods of the above described embodiments. Moreover, as an electronic instrument provided with this circuit board 1000, FIG. 26 shows a notebook personal computer 1200.

The invention claimed is:

1. A semiconductor device, comprising:
   a semiconductor chip that has a first surface on which an electrode is formed:
   a first resin that is provided on the first surface of the semiconductor chip, the first resin avoiding at least a part of the electrode, an edge of the first resin being formed with an inclination;
   a first conducting portion that extends from the electrode to the first resin, the first conducting portion having a connection portion, a first portion of the first conducting portion being formed on the edge of the first resin;
   a ground plane that surrounds the connection portion of the first conducting portion, the ground plane not being in contact with the connection portion of the first conducting portion; and
   an external electrode that is electrically connected to the first conducting portion, the external electrode being formed above the first resin.

2. The semiconductor device of claim 1, the first resin having a depression on its surface, and the first conducting portion being formed to pass over the depression.

3. The semiconductor device of claim 2, further comprising:
   an elastic that is formed on the first conducting portion positioned over the depression, the elastic filling the depression.

4. The semiconductor device of claim 1, the first conducting portion being formed to be bent over the first resin.

5. The semiconductor device of claim 1, a second portion of the first conducting portion being formed on the first resin layer. at least a part of the second portion of the first conducting portion being bent in a direction of a horizontal plane on the first resin.

6. The semiconductor device of claim 4, the first conducting portion being formed to have a bellows shape.

7. The semiconductor device of claim 1, further comprising:
   a second resin that is provided on the first resin; and
   a second conducting portion that is connected to the first conducting portion.

8. The semiconductor device of claim 7, one of two conducting portions including the first conducting portion and the second conducting portion being formed in linear form, and another being formed in planar form to have a larger planar extent than that of the linear conducting portion.

9. The semiconductor device of claim 8, the planar conducting portion having a ground potential, and a signal being inputted in the linear conducting portion.

10. The semiconductor device of claim 1, further comprising:
    a second resin that is provided on the first resin;
    a second conducting portion provided on the second resin;
    a third resin that is provided on the second resin; and
    a third conducting portion provided on the third resin,
    the second conducting portion being formed in linear form, and the first and third conducting portions being formed in planar form to have their larger planar extent than that of the second conducting portion.

11. The semiconductor device of claim 1, further comprising a pair of wires at ground potential formed parallel to and on both sides of the first conducting portion.

12. The semiconductor device of claim 1, further comprising a protective film on a second surface of the semiconductor chip opposite to the first surface.

13. The semiconductor device of claim 1, further comprising a radiator on a second surface of the semiconductor chip opposite to the first surface.

14. A circuit board on which is mounted the semiconductor device of claim 1.

15. An electronic instrument having the circuit board of claim 14.

16. A semiconductor device comprising:
    a semiconductor chip that has a first surface on which a first electrode is formed;
    a first resin that is provided on the first surface of the semiconductor chip, the first resin avoiding at least a part of the first electrode, an edge of the first resin being formed with an inclination;
    a first conducting portion that extends from the first electrode to the first resin, the first conducting portion having a first portion on the first resin, the first conducting portion having a second portion formed on the edge of the first resin;
    a second conducting portion that surrounds at least a part of the first portion of the first conducting portion, the second conducting portion not being in contact with the first portion of the first conducting potion, the second conducting portion being at ground potential; and
    a second electrode that is electrically connected to the first conducting portion, the second electrode being formed above the first resin.

* * * * *

UNITED STATES PATENT AND TRADEMARK OFFICE
CERTIFICATE OF CORRECTION

PATENT NO.       : 7,521,796 B2                               Page 1 of 1
APPLICATION NO.  : 11/480846
DATED            : April 21, 2009
INVENTOR(S)      : Nobuaki Hashimoto It is certified that error appears in the above-identified patent and that said Letters Patent is hereby corrected as shown below:

On the Title Page

Please add Item (30):
  "Dec. 4, 1996  (JP)   ................... 8-339045"
  "Dec. 26, 1996 (JP)   ................... 8-356880"

Signed and Sealed this

Sixth Day of April, 2010

David J. Kappos
*Director of the United States Patent and Trademark Office*